United States Patent
Xin et al.

(10) Patent No.: US 11,792,062 B2
(45) Date of Patent: Oct. 17, 2023

(54) APPARATUS AND METHOD FOR WIRELESS COMMUNICATION

(71) Applicant: HUAWEI TECHNOLOGIES CO., LTD., Guangdong (CN)

(72) Inventors: Yan Xin, Kanata (CA); Jung Hoon Suh, Kanata (CA); Osama S. Aboul-Magd, Ottawa (CA); Kwok Shum Au, Ottawa (CA); Mohamed Adel Salem, Kanata (CA)

(73) Assignee: HUAWEI TECHNOLOGIES CO., LTD., Shenzhen (CN)

( * ) Notice: Subject to any disclaimer, the term of this patent is extended or adjusted under 35 U.S.C. 154(b) by 49 days.

(21) Appl. No.: 17/333,404

(22) Filed: May 28, 2021

(65) Prior Publication Data

US 2022/0385518 A1 Dec. 1, 2022

(51) Int. Cl.
*H04L 27/26* (2006.01)
*H03M 13/25* (2006.01)
(Continued)

(52) U.S. Cl.
CPC ...... *H04L 27/2634* (2013.01); *H03M 13/255* (2013.01); *H04L 27/28* (2013.01); *H04W 84/12* (2013.01)

(58) Field of Classification Search
CPC . H04L 27/2634; H04L 27/28; H04L 27/2602; H04L 1/0041; H04L 1/0058;
(Continued)

(56) References Cited

U.S. PATENT DOCUMENTS

| 10,211,948 B2 * | 2/2019 | Liu ..................... H04L 27/2626 |
| 2016/0323426 A1 * | 11/2016 | Hedayat ............ H04W 28/0268 |

(Continued)

FOREIGN PATENT DOCUMENTS

| CN | 104769880 A | 7/2015 |
| CN | 108370282 A | 8/2018 |
| CN | 112272929 A | 1/2021 |

OTHER PUBLICATIONS

Federal Communications Commission, Report and order and further notice of proposed rulemaking, FCC 20-51, Apr. 24, 2020.

(Continued)

*Primary Examiner* — Oussama Roudani
(74) *Attorney, Agent, or Firm* — BCF LLP

(57) ABSTRACT

The disclosed systems and methods for wireless communication directed are towards (i) encoding data bits to be transmitted over a multiple resource unit (MRU) in a wireless local area network (WLAN), (ii) creating a group of the encoded data bits based on a predetermined criterion, (iii) parsing the encoded bits in the group based on a proportional ratio associated with the MRU, (iv) modulating the parsed encoded data bits to generate modulated encoded data symbols, (v) mapping the modulated encoded data symbols to data subcarriers to generate encoded data subcarriers, the data subcarriers being associated with respective resource units (RUs) of the MRU, (vi) duplicating the encoded data subcarriers within the respective RUs, (vii) shuffling the duplicate encoded data subcarriers across the respective RUs of the MRU, and (viii) transmitting the encoded data subcarriers, and the duplicate encoded data subcarriers over the MRU in the WLAN.

14 Claims, 14 Drawing Sheets

(51) Int. Cl.
*H04L 27/28* (2006.01)
*H04W 84/12* (2009.01)

(58) Field of Classification Search
CPC ... H04L 5/0042; H04L 5/0044; H04L 1/0045; H04L 1/0057; H03M 13/255; H04W 84/12
See application file for complete search history.

(56) References Cited

U.S. PATENT DOCUMENTS

| | | |
|---|---|---|
| 2017/0180177 A1 | 6/2017 | Wu et al. |
| 2017/0230220 A1 | 8/2017 | Anwyl et al. |
| 2020/0322091 A1* | 10/2020 | Noh ............... H04L 27/2602 |
| 2021/0067283 A1* | 3/2021 | Hart ................ H04W 72/0453 |
| 2021/0227510 A1* | 7/2021 | Hu ..................... H04L 1/0071 |
| 2021/0288768 A1* | 9/2021 | Yang ............... H04W 72/0453 |
| 2022/0045889 A1* | 2/2022 | Yu .................... H04W 72/0453 |
| 2022/0278771 A1* | 9/2022 | Park ................... H04L 1/00 |

OTHER PUBLICATIONS

IEEE, Draft Standard for Information technology—Telecommunications and information exchange between systems Local and metropolitan area networks—Specific requirements, IEEE P802.11ax/D6.0, Nov. 2019.

Porat, R., 6GHz LPI Range Extension, IEEE 802-11-20/0965r4, Aug. 2020.

Liu, J. et al., DCM for range extension in 6GHz LPI, IEEE 802.11-20/0986r1, Mar. 2020.

Porat, R. et al., DUP mode PAPR Reduction, IEEE 802.11-20/1191r1, Sep. 2020.

Samsung, Bit to Symbol Mapping for Multiuser Superposition Transmission, 3GPP TSG RAN1 Meeting #82, R1-154184, Beijing, Aug. 24-28, 2015, 9 pages.

International Search Report for co-pending International application No. PCT/CN2022/089202 dated Jun. 29, 2022.

\* cited by examiner

400

402 — encoding data bits to be transmitted over a miltiple resource unit (MRU) in a wireless local area network 404 — creating groups of the encoded data bits for each spatial stream based on a predetermined criterion 406 — parsing the encoded bits in a respective group based on a proportional ratio associated with the MRU 408 — modulating the parsed encoded data bits to generate modulated encoded data symbols 410 — mapping the modulated encoded data symbols to data subcarriers to generate encoded data subcarriers, the data subcarriers being associated with respective resource units (RUs) of the MRU 412 — duplicating the encoded data subcarriers within the respective RUs 414 — shuffling the duplicate encoded date subcarriers between the respective RUs of the MRU 416 — transmitting the encoded data subcarriers and the duplicate encoded data subcarries over the MRU in the WLAN

FIG. 16

APPARATUS AND METHOD FOR WIRELESS COMMUNICATION

CROSS-REFERENCE TO RELATED APPLICATIONS

This is the first application filed for the instantly disclosed technology.

TECHNICAL FIELD

The present disclosure generally relates to communication and, in particular, to an apparatus, and a method for wireless communication.

BACKGROUND

Over the time Wi-Fi technology has evolved to cater to the growing requirements. For instance, dual carrier modulation (DCM) is adopted in IEEE 802.11ax (High Efficiency (HE)) standard for a single resource unit (RU) and is adopted in IEEE802.11be (Extremely High Throughput (EHT)) standard for RU/multiple RUs (MRUs), by duplicating encoded data subcarriers (tones) within a given physical protocol data unit (PPDU) bandwidth (BW). This implies an increase of 3 dB in signal-to-noise ratio (SNR) on an additive white Gaussian noise (AWGN) channel, over previous Wi-Fi standards, for better error rate performance and/or longer range transmission.

Recently, the Federal Communication Commission (FCC) has allowed the entire 6 GHz band (a total 1.2 GHz bandwidth) for unlicensed low power indoor (LPI) operation without automatic frequency control (AFC) access, providing a potential for deployment of next generation Wi-Fi to use channels with bandwidth (BW) up to 320 MHz.

Since other licensed incumbent services such as fixed and mobile services and fixed-satellite services also operate in the 6 GHz band, to prevent harmful interference from incumbent services, FCC sets up rules for unlicensed LPI operations as: (i) limiting to indoor operation only, (ii) requiring contention-based protocol, and (iii) enforcing low power operations.

FCC's rules on LPI operation in 6 GHz enforce 12 dB lower in transmit effective isotropic radiated power (EIRP) power spectral density (PSD) between a low power access point (AP)/non-AP station (STA) operating in LPI in 6 GHz compared to an AP/non-AP STA operating in 5 GHz. This shows that: (i) given the same bandwidth (BW), the link budget for LPI AP is 12 dB lower than that of AP in 5 GHz, the coverage range of the LPI AP is about only ¼ of that AP operating in 5 GHz, and (ii) increasing the transmitting BW can boost up the transmitter power to extend the coverage range. However, increasing the transmitting BW also increases noise power. To maintain the same link performance, SNR should be kept unchanged by increasing the signal energy, i.e., duplicating the transmitted signals is needed with a lower transmission rate.

Further for duplication on DCM-encoded data subcarriers, a duplicate (DUP) mode, has been adopted in EHT standard for single RU only. EHT standard is the next generation of HE standard. Compared to the HE standard, one of the main new features in EHT standard is an efficient spectrum-usage transmission with newly introduced MRUs.

However, there is a need to improve the frequency diversity in DCM-encoded data subcarriers and DUP mode and to have an efficient spectrum usage.

SUMMARY

The embodiments of the present disclosure have been developed based on developers' appreciation of shortcomings associated with the prior arts, namely lack of frequency diversity for dual carrier modulation (DCM)-encoded data subcarriers and duplicate encoded data subcarriers when the transmission is on multiple resource units (MRU).

Developers of the present technology have devised an apparatus and methods to increase the frequency diversity to improve its performance further by shuffling the DCM-encoded data subcarriers across different resource units (RUs) associated with the MRU. The devised apparatus and method also provide several techniques for the duplicate (DUP) mode to support MRU operations in order to increase the spectrum-usage efficiency. The devised apparatus and methods also provide duplicating the encoded data subcarriers and DCM-encoded data subcarriers to further enhance the frequency diversity, the devised apparatus and method support shuffling of DCM-encoded data subcarriers, duplicate encoded data subcarriers, and duplicate DCM-encoded data subcarriers. Also, the devised apparatus and method provide grouping of data subcarriers after encoding and LDPC tone mapping with LDPC tone mapping parameters to support the DUP mode for MRU.

In accordance with a first broad aspect of the present disclosure, there is provided an apparatus for wireless communication comprising: an encoder configured to encode data bits to be transmitted over a multiple resource unit (MRU) in a wireless local area network (WLAN); a segment parser configured to: create a group of the encoded data bits for each spatial stream based on a predetermined criterion; and parse the encoded bits in the group based on a proportional ratio associated with the MRU; a constellation mapper configured to: modulate the parsed encoded data bits to generate modulated encoded data symbols; map the modulated encoded data symbols to data subcarriers to generate encoded data subcarriers, the data subcarriers being associated with respective resource units (RUs) of the MRU; duplicate the encoded data subcarriers within the respective RUs without performing dual carrier modulation (DCM) over the encoded data subcarriers; and a transmitter configured to transmit the encoded data subcarriers and the duplicate encoded data subcarriers over the MRU in the WLAN.

In accordance with other aspects of the present disclosure, the apparatus, wherein the constellation mapper is further configured to shuffle the duplicate encoded data subcarriers across the respective RUs of the MRU.

In accordance with other aspects of the present disclosure, the apparatus, wherein the predetermined criterion is to: determine a number of data subcarriers $N_{SD}$ associated with the MRU, and determine a number of data subcarriers $N_{SD,DUP}$ by dividing the number of data subcarriers $N_{SD}$ by a number of times the encoded data subcarriers is to be duplicated within the respective RU.

In accordance with other aspects of the present disclosure, the apparatus, wherein a number of encoded data bits in the group for each spatial stream is equal to $M \times N_{SD,DUP}$, where M is the order of modulation.

In accordance with other aspects of the present disclosure, the apparatus further comprising a low density parity check (LDPC) tone mapper configured to perform LDPC tone mapping to the encoded data subcarriers and the duplicate encoded data subcarriers in accordance with a candidate LDPC tone mapping distance as calculated based the number of data subcarriers $N_{SD,DUP}$.

In accordance with a second broad aspect of the present disclosure, there is provided an apparatus for wireless communication comprising: an encoder configured to encode data bits to be transmitted over a multiple resource unit (MRU) in a wireless local area network (WLAN); a segment parser configured to: create a group of the encoded data bits for each spatial stream based on a predetermined criterion; and parse the encoded bits in the group based on a proportional ratio associated with the MRU; a constellation mapper configured to: modulate the parsed encoded data bits to generate modulated encoded data symbols; map the modulated encoded data symbols to data subcarriers to generate encoded data subcarriers, the data subcarriers being associated with respective resource units (RUs) of the MRU; perform dual carrier modulation (DCM) over the encoded data subcarriers associated with the respective RUs to generate DCM-encoded data subcarriers; duplicate the encoded data subcarriers and the DCM-encoded data subcarriers within the respective RU to generate duplicate encoded data subcarriers and duplicate DCM-encoded data subcarriers; and a transmitter configured to transmit the encoded data subcarriers, the DCM-encoded data subcarriers, the duplicate encoded data subcarriers, and the duplicate DCM-encoded data subcarriers over the MRU in the WLAN.

In accordance with other aspects of the present disclosure, the apparatus, wherein prior to transmitting the encoded data subcarriers, the DCM-encoded data subcarriers, the duplicate encoded data subcarriers, and the duplicate DCM-encoded data subcarriers, the constellation mapper is further configured to shuffle the DCM-encoded data subcarriers, the duplicate encoded data subcarriers, and the duplicate DCM-encoded data subcarriers across the respective RUs of the MRU.

In accordance with other aspects of the present disclosure, the apparatus, wherein the predetermined criterion is to: determine a number of data subcarriers $N_{SD}$ associated with the MRU, and determine a number of data subcarriers $N_{SD,DUP}$ by dividing the number of data subcarriers $N_{SD}$ by a number of times the encoded data subcarriers is to be duplicated within the respective RU.

In accordance with other aspects of the present disclosure, the apparatus, wherein a number of encoded data bits in the group for each spatial stream is equal to $M \times N_{SD,DUP}$, where M is the order of modulation.

In accordance with other aspects of the present disclosure, the apparatus, further comprising a low density parity check (LDPC) tone mapper configured to perform LDPC tone mapping to the encoded data subcarriers, the duplicate encoded data subcarriers, the DCM-encoded data subcarriers, and the duplicate DCM-encoded data subcarriers in accordance with a candidate LDPC tone mapping distance as calculated based the number of data subcarriers $N_{SD,DUP}$.

In accordance with other aspects of the present disclosure, the apparatus, wherein a number of the encoded data subcarriers and a number of the DCM-encoded data subcarriers is the same.

In accordance with other aspects of the present disclosure, the apparatus, wherein a number of the DCM-encoded data subcarriers is divided into two equal halves.

In accordance with a third broad aspect of the present disclosure, there is provided a method for wireless communication comprising: encoding data bits to be transmitted over a multiple resource unit (MRU) in a wireless local area network (WLAN); creating a group of the encoded data bits for each spatial stream based on a predetermined criterion; parsing the encoded bits in the group based on a proportional ratio associated with the MRU; modulating the parsed encoded data bits to generate modulated encoded data symbols; mapping the modulated encoded data symbols to data subcarriers to generate encoded data subcarriers, the data subcarriers being associated with respective resource units (RUs) of the MRU; duplicating the encoded data subcarriers within the respective RUs; shuffling the duplicate encoded data subcarriers across the respective RUs of the MRU; and transmitting the encoded data subcarriers, and the duplicate encoded data subcarriers over the MRU in the WLAN.

In accordance with other aspects of the present disclosure, the method, further comprising: performing dual carrier modulation (DCM) over the encoded data subcarriers associated with the respective RUs to generate DCM-encoded data subcarriers prior to duplicating the encoded data subcarriers within the respective RU; duplicating the DCM-encoded data subcarriers within the respective RUs; shuffling the DCM-encoded data subcarriers, the duplicate encoded data subcarriers, and the duplicate DCM-encoded data subcarriers across the respective RUs of the MRU; and transmitting the encoded data subcarriers, the DCM-encoded data subcarriers, the duplicate encoded data subcarriers, and the duplicate DCM-encoded data subcarriers over the MRU in the WLAN.

In accordance with other aspects of the present disclosure, the method, wherein the predetermined criterion is to: determine a number of data subcarriers $N_{SD}$ associated with the MRU, and determine a number of data subcarriers $N_{SD,DUP}$ by dividing the number of data subcarriers $N_{SD}$ by a number of times the encoded data subcarriers is to be duplicated within the respective RU.

In accordance with other aspects of the present disclosure, the method, wherein a number of encoded data bits in the group for each spatial stream is equal to $M \times N_{SD,DUP}$, where M is the order of modulation.

In accordance with other aspects of the present disclosure, the method, further comprising further comprising performing low density parity check (LDPC) tone mapping to the encoded data subcarriers, the duplicate encoded data subcarriers, the DCM-encoded data subcarriers, and the duplicate DCM-encoded data subcarriers in accordance with a candidate LDPC tone mapping distance as calculated based on the number of data subcarriers $N_{SD,DUP}$.

In accordance with a fourth broad aspect of the present disclosure, there is provided an apparatus for wireless communication comprising: an encoder configured to encode data bits to be transmitted over a multiple resource unit (MRU) in a wireless local area network (WLAN); a segment parser configured to: create a group of the encoded data bits for each spatial stream based on a predetermined criterion; and parse the encoded bits in the group based on a proportional ratio associated with the MRU; a constellation mapper configured to: modulate the parsed encoded data bits to generate modulated encoded data symbols; map the modulated encoded data symbols to data subcarriers to generate encoded data subcarriers, the data subcarriers being associated with respective resource units (RUs) of the MRU; perform dual carrier modulation (DCM) over the encoded data subcarriers associated with the respective RUs to generate DCM-encoded data subcarriers; shuffle the DCM-encoded data subcarriers across the respective RUs of the MRU; and a transmitter configured to transmit the encoded data subcarriers and the shuffled DCM-encoded data subcarriers over the MRU in the WLAN.

In accordance with other aspects of the present disclosure, the apparatus, wherein the predetermined criterion is to: determine a number of data subcarriers $N_{SD}$ associated with the MRU, and determine a number of data subcarriers $N_{SD,DCM}$ by dividing the number of data subcarriers $N_{SD}$ by a number of times the encoded data subcarriers is to be duplicated within the respective RU.

In accordance with other aspects of the present disclosure, the apparatus, wherein a number of encoded data bits in the group for each spatial stream is equal to $M \times N_{SD,DCM}$, where M is the order of modulation.

BRIEF DESCRIPTION OF THE FIGURES

Further features and advantages of the present disclosure will become apparent from the following detailed description, taken in combination with the appended drawings, in which:

FIG. 16 depict a flowchart representing a method for wireless communication, in accordance with various embodiments of the present disclosure.

Figure 1:
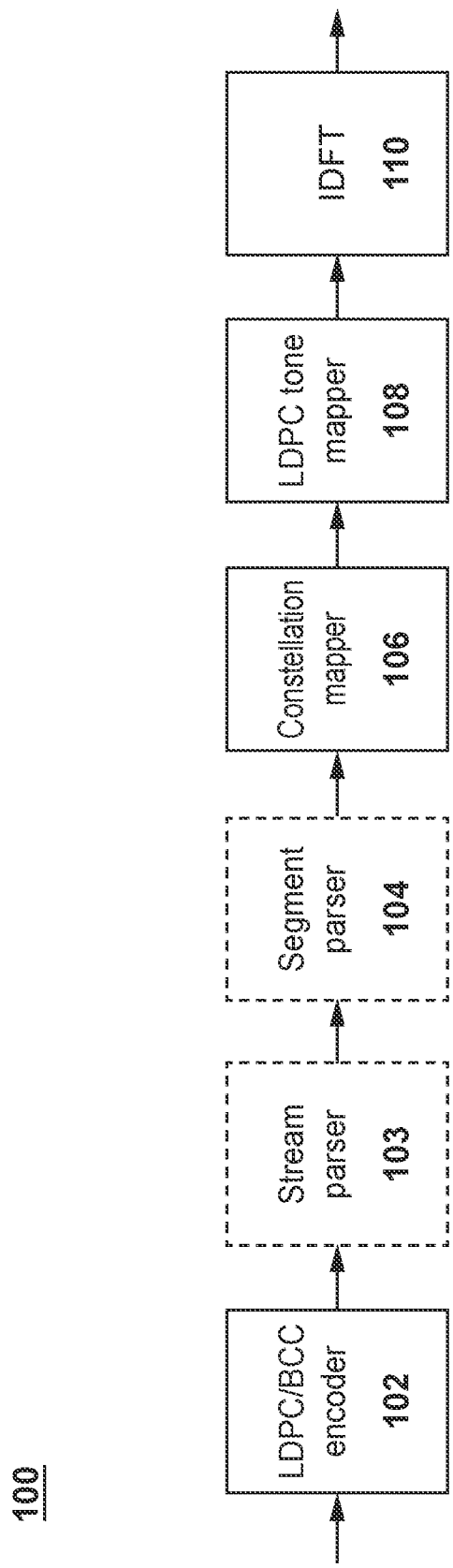
FIG. 1 (Prior Art) illustrates a high-level functional block diagram of a portion of a conventional Wi-Fi apparatus.

It is to be understood that throughout the appended drawings and corresponding descriptions, like features are identified by like reference characters. Furthermore, it is also to be understood that the drawings and ensuing descriptions are intended for illustrative purposes only and that such disclosures do not provide a limitation on the scope of the claims.

DETAILED DESCRIPTION

The instant disclosure is directed to address at least some of the deficiencies of the current technology. In particular, the instant disclosure describes an apparatus and method for wireless communication.

Unless otherwise defined or indicated by context, all technical and scientific terms used herein have the same meaning as commonly understood by one of ordinary skill in the art to which the described embodiments appertain to.

In the context of the present specification, "Wi-Fi apparatus" is any computer hardware that is capable of running software appropriate to the relevant task at hand. In the context of the present specification, in general the term "Wi-Fi apparatus" is associated with a user of the Wi-Fi apparatus. Thus, some (non-limiting) examples of Wi-Fi apparatus include personal computers (desktops, laptops, netbooks, etc.), smartphones, and tablets, as well as network equipment such as routers, switches, modems and gateways. It should be noted that an apparatus acting as a Wi-Fi apparatus in the present context is not precluded from acting as an access point to other Wi-Fi apparatuses.

In the context of the present specification, unless provided expressly otherwise, the words "first", "second", "third", etc. have been used as adjectives only for the purpose of allowing for distinction between the nouns that they modify from one another, and not for the purpose of describing any particular relationship between those nouns. Thus, for example, it should be understood that, the use of the terms "first processor" and "third processor" is not intended to imply any particular order, type, chronology, hierarchy or ranking (for example) of/between the server, nor is their use (by itself) intended to imply that any "second server" must necessarily exist in any given situation. Further, as is discussed herein in other contexts, reference to a "first" element and a "second" element does not preclude the two elements from being the same actual real-world element. Thus, for example, in some instances, a "first" server and a "second" server may be the same software and/or hardware, in other cases they may be different software and/or hardware.

It will be understood that when an element is referred to as being "connected" or "coupled" to another element, it can be directly or indirectly connected or coupled to the other element or intervening elements that may be present. In contrast, when an element is referred to as being "directly connected" or "directly coupled" to another element, there are no intervening elements present. Other words used to describe the relationship between elements should be interpreted in alike fashion (e.g., "between" versus "directly between," "adjacent" versus "directly adjacent," etc.).

In the context of the present specification, when an element is referred to as being "associated with" another element, in certain embodiments, the two elements can be directly or indirectly linked, related, connected, coupled, the second element employs the first element, or the like without limiting the scope of present disclosure.

The terminology used herein is only intended to describe particular representative embodiments and is not intended to be limiting of the present technology. As used herein, the singular forms "a," "an" and "the" are intended to include the plural forms as well, unless the context clearly indicates otherwise. It will be further understood that the terms "comprises" and/or "comprising", when used in this specification, specify the presence of stated features, integers, steps, operations, elements, and/or components, but do not preclude the presence or addition of one or more other features, integers, steps, operations, elements, components, and/or groups thereof.

Implementations of the present technology each have at least one of the above-mentioned objects and/or aspects, but do not necessarily have all of them. It should be understood that some aspects of the present technology that have resulted from attempting to attain the above-mentioned object may not satisfy this object and/or may satisfy other objects not specifically recited herein.

The examples and conditional language recited herein are principally intended to aid the reader in understanding the principles of the present technology and not to limit its scope to such specifically recited examples and conditions. It will be appreciated that those skilled in the art may devise various arrangements which, although not explicitly described or shown herein, nonetheless embody the principles of the present technology and are included within its spirit and scope.

Furthermore, as an aid to understanding, the following description may describe relatively simplified implementations of the present technology. As persons skilled in the art would understand, various implementations of the present technology may be of a greater complexity.

In some cases, what are believed to be helpful examples of modifications to the present technology may also be set forth. This is done merely as an aid to understanding, and, again, not to define the scope or set forth the bounds of the present technology. These modifications are not an exhaustive list, and a person skilled in the art may make other modifications while nonetheless remaining within the scope of the present technology. Further, where no examples of modifications have been set forth, it should not be interpreted that no modifications are possible and/or that what is described is the sole manner of implementing that element of the present technology.

Moreover, all statements herein reciting principles, aspects, and implementations of the present technology, as well as specific examples thereof, are intended to encompass both structural and functional equivalents thereof, whether they are currently known or developed in the future. Thus, for example, it will be appreciated by those skilled in the art that any block diagrams herein represent conceptual views of illustrative circuitry embodying the principles of the present technology. Similarly, it will be appreciated that any flowcharts, flow diagrams, state transition diagrams, pseudo-code, and the like represent various processes which may be substantially represented in computer-readable media and so executed by a computer or processor, whether or not such computer or processor is explicitly shown.

The functions of the various elements shown in the figures, including any functional block labeled as a "processor" or a "processing unit", may be provided through the use of dedicated hardware as well as hardware capable of executing software in association with appropriate software. When provided by a processor, the functions may be provided by a single dedicated processor, by a single shared processor, or by a plurality of individual processors, some of which may be shared. In some embodiments of the present technology, the processor may be a general-purpose processor, such as a central processing unit (CPU) or a processor dedicated to a specific purpose, such as a graphics processing unit (GPU). Moreover, explicit use of the term "processor" or "controller" should not be construed to refer exclusively to hardware capable of executing software, and may implicitly include, without limitation, digital signal processor (DSP) hardware, network processor, application specific integrated circuit (ASIC), field programmable gate array (FPGA), read-only memory (ROM) for storing software, random access memory (RAM), and non-volatile storage. Other hardware, conventional and/or custom, may also be included.

In the context of the present disclosure, the expression "data" includes data of any nature or kind whatsoever capable of being stored in a database. Thus, data includes, but is not limited to, audiovisual works (images, movies, sound records, presentations etc.), data (location data, numerical data, etc.), text (opinions, comments, questions, messages, etc.), documents, spreadsheets, etc.

Software modules, modules, or units which are implied to be software, may be represented herein as any combination of flowchart elements or other elements indicating performance of process steps and/or textual description. Such modules may be executed by hardware that is expressly or implicitly shown.

With these fundamentals in place, the instant disclosure is directed to address at least some of the deficiencies of the current technology. In particular, the instant disclosure describes an apparatus and method for wireless communication.

FIG. 1 (Prior Art) illustrates a high-level functional block diagram of a conventional Wi-Fi apparatus 100. As shown the conventional Wi-Fi apparatus 100 includes a low density parity check (LDPC)/binary convolution code (BCC) encoder 102, a segment parser 104, a constellation mapper 106, an LDPC tone mapper 108 (if LDPC encoding is deployed), and inverse discrete Fourier transformation (IDFT) module 110. In case where there are multiple streams of encoded data bits to be transmitted in a multiple-input multiple-output (MIMO) system, the conventional Wi-Fi apparatus 100 may include a stream parser 103, multiple segment parsers 104, multiple constellation mappers 106, multiple LDPC tone mappers 108 (if LDPC encoding is deployed), and multiple IDFT modules 110. It is to be noted the conventional Wi-Fi apparatus 100 may include other components such as suitable antenna structure for transmission and reception of wireless signals, memory elements to store certain instructions, processors to execute the instructions. Such components have been omitted from FIG. 1 for the purpose of simplicity.

While most of the components associated with the conventional Wi-Fi apparatus 100 compliance with IEEE 802.11ax (High Efficiency (HE)) standard, some of the components may comply with IEEE 802.11be (Extremely High Throughput (EHT)) standard as well.

Typically, HE standard supports Orthogonal Frequency-Division Multiple Access (OFDMA) transmission in which different stations (STA) (not depicted) can be multiplexed within an OFDM symbol, each of which is allocated with a group of consecutive subcarriers (also referred to as tones). A group of consecutive subcarriers is referred to as a resource unit (RU) and a group of RUs is referred to as a multiple RU (MRU). Both the RU and the MRU are defined in the frequency domain.

EHT standard is the next generation of HE standard. Just like HE standard, EHT standard also supports OFDMA transmission. In EHT standard, the multiple resource units (MRUs) feature allows EHT standard to use MRUs for a single STA to improve the spectral efficiency.

Based on the sizes, RUs are defined as: 26-tone RU, 52-tone RU, 106-tone RU are referred to as small RUs, 242-tone RU (occupying 20 MHz), 484-tone RU (occupying 40 MHz), 996-tone RU (occupying 80 MHz), 2×996-tone RU (occupying 160 MHz), 4×996-tone RU (occupying 320 MHz) are referred to as large RUs.

As per EHT standard, different RUs can be aggregated to form MRUs. However, only small-size RUs (i.e., 26-, 52-, 106-tone RUs) can be aggregated together to form MRUs, for example, (26+52); (26+106). Similarly, only large-sized RUs (i.e., 242-, 484, 996-tone RUs) can be aggregated together to form MRUs, for example (484+242); (996+484); (996+484+242); (2×996+484); 3×996; (3×996+484).

Also, in the current development of the EHT standard, dual carrier modulation (DCM) is adopted for RUs and MRUs. Although, the DCM is applied by the constellation mapper 106, the sizes of RUs and the MRUs should be in accordance with as defined by the EHT standard. Further, $N_{SD}$ represents a total number of data subcarriers in RU/MRU.

Table 1 shows the number of data subcarriers, $N_{SD}$ as defined by the EHT standard, corresponding to the single RU size for the cases without DCM.

TABLE 1

| RU size | 26 | 52 | 106 | 242 | 484 | 996 | 2 × 996 | 4 × 996 |
|---|---|---|---|---|---|---|---|---|
| $N_{SD}$ | 24 | 48 | 102 | 234 | 468 | 980 | 1960 | 3920 |

In the above table, the number of data subcarriers, $N_{SD}$ is less than the size of RU. It is to be noted that the remaining subcarriers are used to carry other information such as, pilot tones, DC tones and guard tones.

Table 2 shows the number of data subcarriers, $N_{SD}$ as defined by the EHT standard, corresponding to the MRU size for the cases without DCM.

TABLE 2

| MRU Size | 26 + 52 | 26 + 106 | 484 + 242 | 996 + 484 | 996 + 484 + 242 | 2 × 996 + 484 | 3 × 996 | 3 × 996 + 484 |
|---|---|---|---|---|---|---|---|---|
| $N_{SD}$ | 72 | 126 | 702 | 1448 | 1682 | 2428 | 2940 | 3408 |

In the above table, the number of data subcarriers, $N_{SD}$ is less than the size of MRU. It is to be noted that the remaining subcarriers are used to carry other information such as, pilot tones, DC tones and guard tones.

It is to be noted that if DCM is to be applied over the data subcarriers for transmission, to cater to the number of subcarriers required for DCM with the RU/MRU, a total number of DCM data subcarriers $N_{SD,DCM}$ is equal to half of the values of $N_{SD}$ as shown in the Tables 1 and 2 above. The EHT standard supports only BPSK modulated data subcarriers so far for DCM operation.

With these standards in place, the LDPC/BCC encoder 102 is configured to receive and encode data bits. The encoded data bits are transmitted to other components of the conventional Wi-Fi apparatus 100 as PPDUs. In case, the PPDU BW is greater than 80 MHz, for example, 160 MHz or 320 MHz, the segment parser 104 may be configured to divide the PPDU BW into multiple 80 MHz subblocks. In such cases, the segment parser 104 is used to parse the encoded data bits for RU/MRU. The segment parser 104 is used to divide those encoded bits (for each spatial stream) into multiple frequency subblocks in a proportional round robin fashion (for large size RUs, a subblock size is 484-tone, (484+242)-tone or 996-tone) as described in Table 3. This operation is bypassed for RUs or MRUs of smaller sizes.

TABLE 3

| MRU | RU order (low to high frequency) | $N_{SD}$ | Proportional ratio |
|---|---|---|---|
| 484 + 996 | 484 + 996 | 1448 | 1s:2s |
|  | 996 + 484 | 1448 | 2s:1s |
| (242 + 484) + 996 | (242 + 484) + 996 | 1682 | 3s:4s |
|  | 996 + (242 + 484) | 1682 | 4s:3s |
| 484 + 2 × 996 | 484 + 996 + 996 | 2428 | 1s:2s:2s |
|  | 996 + 484 + 996 | 2428 | 2s:1s:2s |
|  | 996 + 996 + 484 | 2428 | 2s:2s:1s |
| 484 + 3 × 996 | 484 + 996 + 996 + 996 | 3408 | 1s:2s:2s:2s |
|  | 996 + 484 + 996 + 996 | 3408 | 2s:1s:2s:2s |
|  | 996 + 996 + 484 + 996 | 3408 | 2s:2s:1s:2s |
|  | 996 + 996 + 996 + 484 | 3408 | 2s:2s:2s:1s |
| 2 × 996 | 996 + 996 | 1960 | 1s:1s |
| 3 × 996 | 996 + 996 | 2940 | 1s:1s:1s |
| 4 × 996 | 996 + 996 + 996 + 996 | 3920 | 1s:1s:1s |

As previously noted, in case of multiple encoded data bits corresponding to the inputs in MIMO configuration, the conventional Wi-Fi apparatus 100 may include a stream parser 103. The stream parser 103 is configured to parse the multiple encoded data bits depending upon the number of spatial streams. By way of an example, if multiple encoded data bits are transmitted over 4 spatial streams, the stream parser 103 may parse the multiple encoded data bits into 4 spatial streams of encoded data bits. Each spatial stream is processed in parallel using multiple segment parsers 104, multiple constellation mappers 106, multiple LDPC tone mappers 108, and multiple IDFT modules 110.

Figure 2:
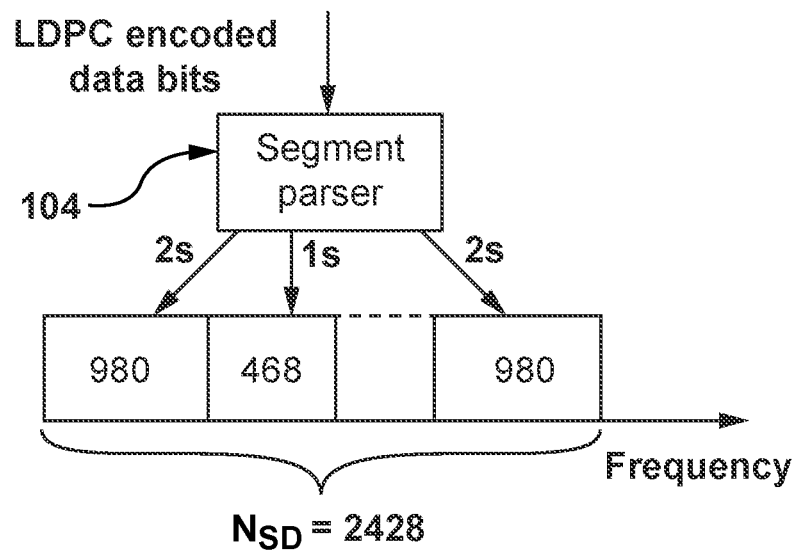
FIG. 2 (Prior Art) illustrates an example of segment parsing for (996+484+996)-tone MRU.

FIG. 2 (Prior Art) illustrates an example of segment parsing for (996+484+996)-tone MRU. Assuming that PPDU BW is 320 MHz with punctured 80 MHz plus 40 MHz, the segment parser 104 parses the bandwidth of the encoded data bits into multiple 80 MHz subblocks such as, 3 subblocks of 80 MHz in the above example. Each of the 2×960-tone RUs occupying a bandwidth of 80 MHz and 480-tone RU occupying a bandwidth of 40 MHz in the subblock of 80 MHz. It is to be noted that, using Table 3 corresponding to $N_{SD}$=2428, the segment parser may choose any combination of MRUs.

The segment parser 104 provides the segmented encoded data bits to the constellation mapper 106. The constellation mapper 106 may be configured to perform DCM over the segmented encoded data bits and maps the segmented encoded data bits to data subcarriers associated with the RU/MRU.

In case, the constellation mapper 106 is following the HE standards, which includes the use of DCM, the constellation mapper 106 modulates the same information bits on a pair of symbols ($d_k$, $d_{q(k)}$) carried by a pair of DCM subcarriers with indices (k, q(k)), where $q(k)=k+N_{SD,DCM}$, $0 \le k \le N_{SD,DCM}-1$. It may be noted that, given that DCM is used, $N_{SD,DCM}$ is half the value of $N_{SD}$ without DCM as illustrated in Tables 1, 2, and 3.

The lower half of the data subcarriers in the RU are denoted as $d=(d_0, d_1, \ldots, d_{N_{SD,DCM}-1})$ and the upper half of the data subcarriers in the RU are denoted as $d_{DCM}$. For $d_{DCM}$, the DCM modulated data subcarriers are related to the respective data subcarriers in d with possible modifications based on the BPSK, QPSK or 16-QAM constellation.

By way of an example, the encoded data bits corresponding to the data subcarriers ($B_0$, $B_1$, ..., $B_{N_{SD,DCM}-1}$) are provided as input to the constellation mapper 106, for: (i) BPSK modulation: $d_k = B_k$ and $d_{k=N_{SC,DCM}} = d_k \times e^{j(k+N_{SD,DCM})\pi}$, (ii) QPSK modulation: each pair of bits ($B_{2k}$, $B_{2k+1}$) is QPSK-modulated to be $d_k \cdot d_{k+N_{SD,DCM}} = \text{conj}(d_k)$, (iii) 16-QAM modulation: a group of 4 bits ($B_{4k}$, $B_{4k+1}$, $B_{4k+2}$, $B_{4k+3}$) is 16-QAM modulated to be $d_k \cdot d_{k+N_{SD,DCM}}$ by applying 16-QAM modulation to bit group ($B_{4k+1}$, $B_{4k}$, $B_{4k+3}$, $B_{4k+2}$).

Figure 3:
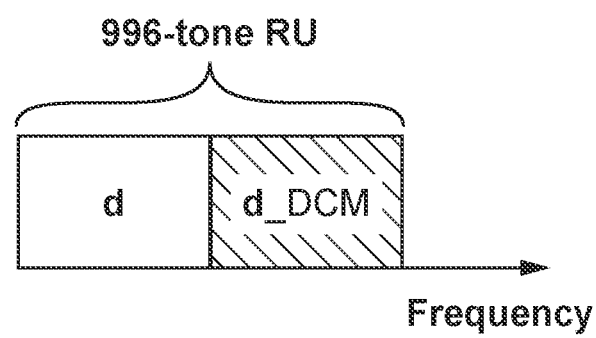
FIG. 3 (Prior Art) illustrates an example of DCM for the 996-tone RU.

FIG. 3 (Prior Art) illustrates an example of DCM for the 996-tone RU. As shown, first half of the data subcarriers (i.e., 40 MHz) for single 996-tone RU is occupied by d and the other half of the data subcarriers (i.e., 40 MHz) is occupied by $d_{DCM}$.

In case, the constellation mapper 106 is following the EHT standards, DCM is employed for a 996-tone or smaller RU, the process of DCM in EHT standard is the same as that in HE standard. For an RU or MRU having a size larger than 996-tone, DCM is performed within each 80 MHz subblock only.

Figure 4:
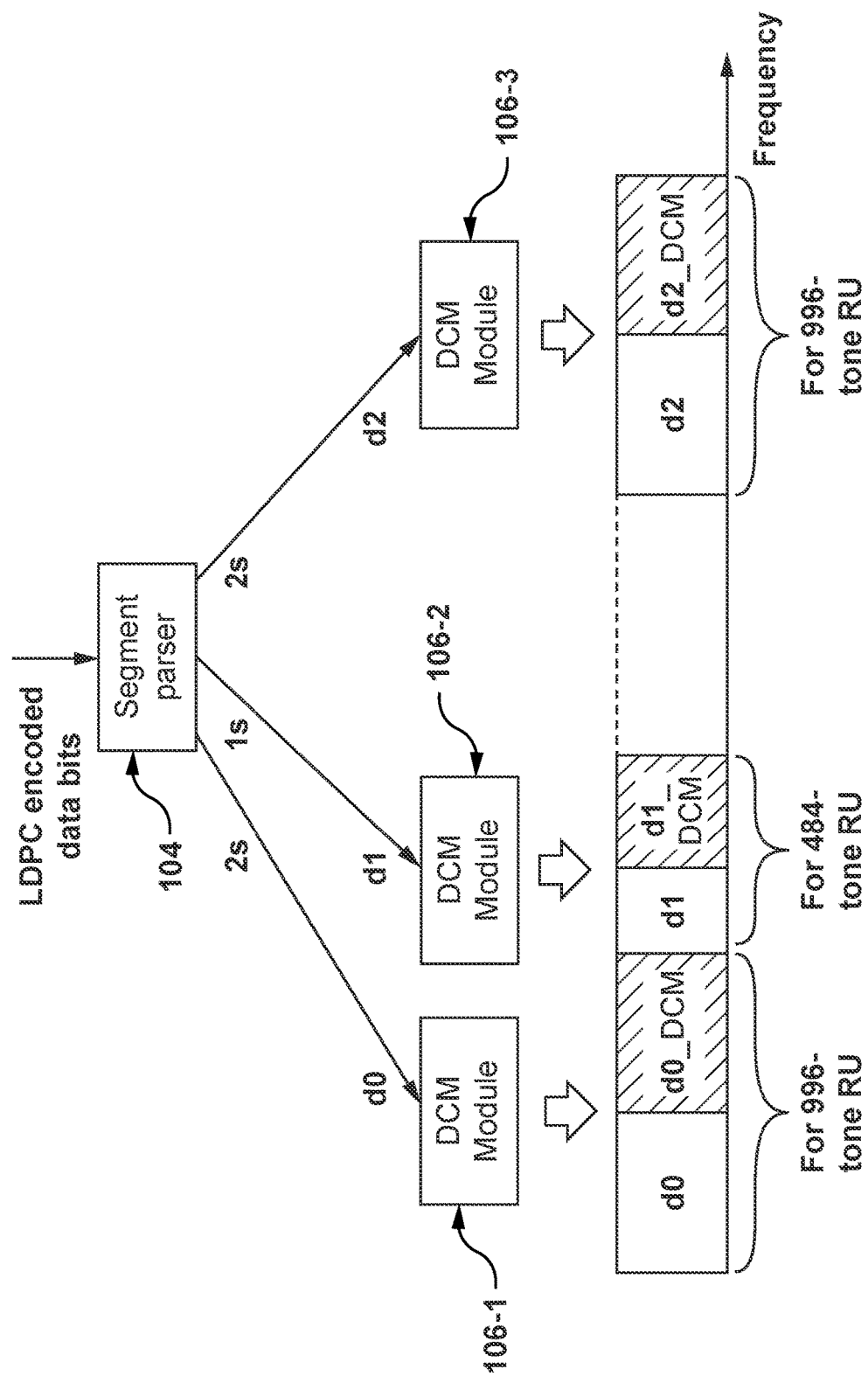
FIG. 4 (Prior Art) is an illustration of DCM for (996+484+996)-tone MRU.

FIG. 4 (Prior Art) is an illustration of DCM for (996+484+996)-tone MRU. By way of example, for (996+484+996)-tone MRU, the segment parser 104 distributes $$N_{SD,DCM} = \frac{2428}{2} = 1214$$

encoded data bits to the respective three subgroups of encoded data bits as $d_0$, $d_1$, $d_2$. The subgroup $d_0$ is provided to DCM module 106-1, subgroup $d_1$ is provided to DCM module 106-2, and subgroup $d_2$ is provided to DCM module 106-3. The DCM modules 106-1, 106-2, and 106-3 are implemented on the constellation mapper 106 as sub-modules. As illustrated, the DCM modules 106-1, 106-2, and 106-3 perform DCM separately within each RU of the (996+484+996)-tone MRU.

Further, a duplicate (DUP) mode is also adopted in EHT standard, in which the DCM-encoded data subcarriers over the frequency domain are further duplicated one more time to support single RU only. However, the current version of the DUP mode adopted in EHT standard does not support MRU operations. In other words, the encoded data bits cannot be duplicated during MRU operations without first performing the DCM operation.

DUP mode is proposed in EHT standard to maximize the usage of BW to increase the transmitting power. DUP mode duplicates the DCM modulated data tones in frequency domain for 80, 160, and 320 MHz full BW usage without MRU, i.e., (i) in DUP80 mode, the encoded data bits of a 242-tone RU with DCM is duplicated twice to occupy 80 MHz BW, (ii) in DUP160 mode, the encoded data bits of a 484-tone RU with DCM is duplicated twice to occupy 160 MHz BW, and (iii) in DUP320 mode, the encoded data bits of a 996-tone RU with DCM is duplicated twice to occupy 320 MHz BW.

Figure 5:
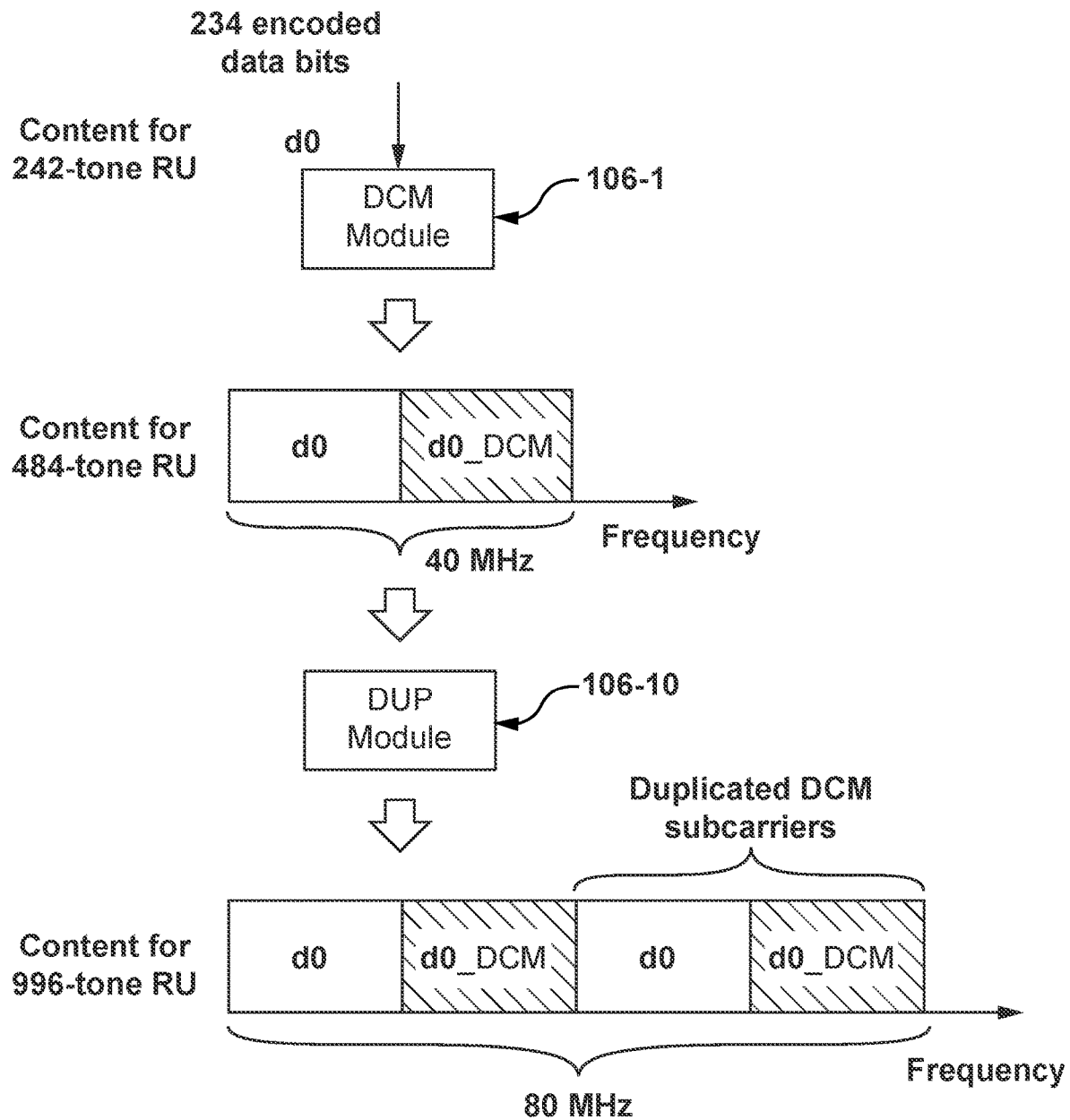
FIG. 5 (Prior Art) illustrates a DUP mode operation with PPDU BW 80 MHz.

FIG. 5 (Prior Art) illustrates a DUP mode operation with PPDU BW 80 MHz, i.e., DUP80. As shown, the DCM module 106-1 performs DCM over 234 encoded data subcarriers $d_0$. 234 encoded data subcarriers $d_0$ and 234 DCM encoded data subcarriers $d_{0DCM}$ are mapped to 484-tone RU of 40 MHz. The constellation mapper 106 further includes DUP module 106-10 to duplicate 484-tone RU over 996-tone RU.

Returning to FIG. 1, the LDPC tone mapper 108 performs LDPC tone mapping to the LDPC encoded data subcarriers after constellation mapping and DCM (if DCM is applicable) performed by the constellation mapper 106. In case DCM is performed, the LDPC tone mapper 108 applies permuting to two parts of data subcarriers separately. LDPC tone mapping parameters are defined for an RU/MRU within an 80 MHz subblock. The distance parameters for the case without and with DCM are denoted as $D_{TM}$ and $D_{TM\_DCM}$, respectively. If DCM is not applied, the tone $d_k$ is permuted to be $d_{t(k)}'$ based on following equation:

$$d'_{t(k)} = D_{TM}\left(k \bmod \frac{N_{SD}}{D_{TM}}\right) + \left\lfloor \frac{k \cdot D_{TM}}{N_{SD}} \right\rfloor \text{ where } k = 0, 1, \ldots, N_{SD} - 1$$

Table 4 below lists the LDPC tone mapper parameters $D_{TM}$ and $D_{TM,DCM}$ for given RU/MRU sizes in EHT standard.

TABLE 4

| Parameter | RU/MRU size (tones) | | | | | | | | |
|---|---|---|---|---|---|---|---|---|---|
| | 26 | 52 | 52 + 26 | 106 | 106 + 26 | 242 | 484 | 242 + 484 | 996 |
| $D_{TM}$ | 1 | 3 | 4 | 6 | 6 | 9 | 12 | 18 | 20 |
| $D_{TM, DCM}$ | 1 | 1 | 3 | 3 | 3 | 9 | 9 | 9 | 14 |

For an RU/MRU spanning multiple 80 MHz frequency subblocks, LDPC tone mapping is performed separately within each subblock on the RU/MRU falling within that subblock. $N_{SD}$ and $N_{SD,DCM}$ may be a multiple of $D_{TM}$ and $D_{TM,DCM}$ respectively in order to perform tone mapping based on the aforementioned algorithm.

Figure 6:
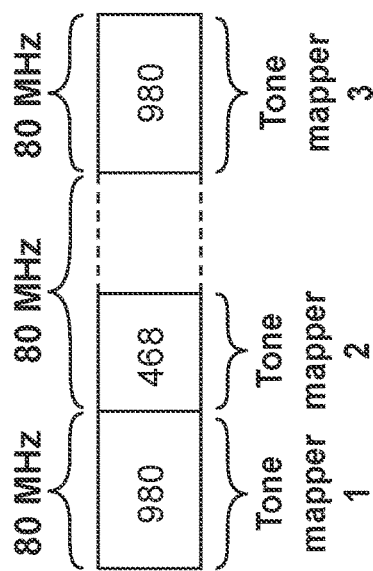
FIG. 6 (Prior Art) illustrates an example of low density parity check (LDPC) tone mapping for (996+484+996)-tone MRU without DCM.
Figure 7:
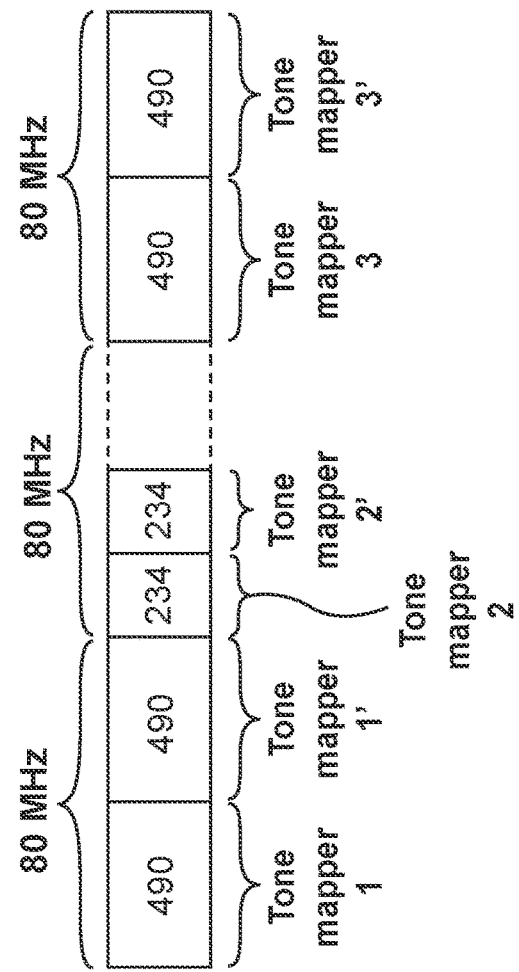
FIG. 7 (Prior Art) illustrates an example of LDPC tone mapping for (996+484+996)-tone MRU with DCM.

FIG. 6 (Prior Art) illustrates an example of LDPC tone mapping for (996+484+996)-tone MRU without DCM. FIG. 7 (Prior Art) illustrates an example of LDPC tone mapping for (996+484+996)-tone MRU with DCM.

Retuning to FIG. 1, the IDFT module 110 is configured to convert the frequency-domain data on the subcarriers to the time-domain signals and forwarding the time-domain signals to antenna structure (not depicted) for transmission.

As noted above, EHT standard has adopted DCM duplication of the data subcarriers, however, the DCM duplication is limited within each subblock of 80 MHz. Further, EHT standard has adopted the DUP mode to further duplicate the DCM duplicated data subcarriers one more time to support only single RU and not the MRUs.

With this said, developers of the present technology have devised an apparatus and a method to increase the frequency diversity for a large PPDU BW (>80 MHz) for DCM PPDU to improve its performance further by multiplexing DCM-encoded data subcarriers across 80 MHz subblocks. In addition, in an embodiment, the devised apparatus and method provide several techniques for the DUP mode to support MRU operations in order to increase the spectrum-usage efficiency. Also, in the same or another embodiment, the devised apparatus and method provide grouping of data subcarriers after encoding and modulation and LDPC tone mapping with LDPC tone mapping parameters to support the DUP mode for MRU.

Figure 8:
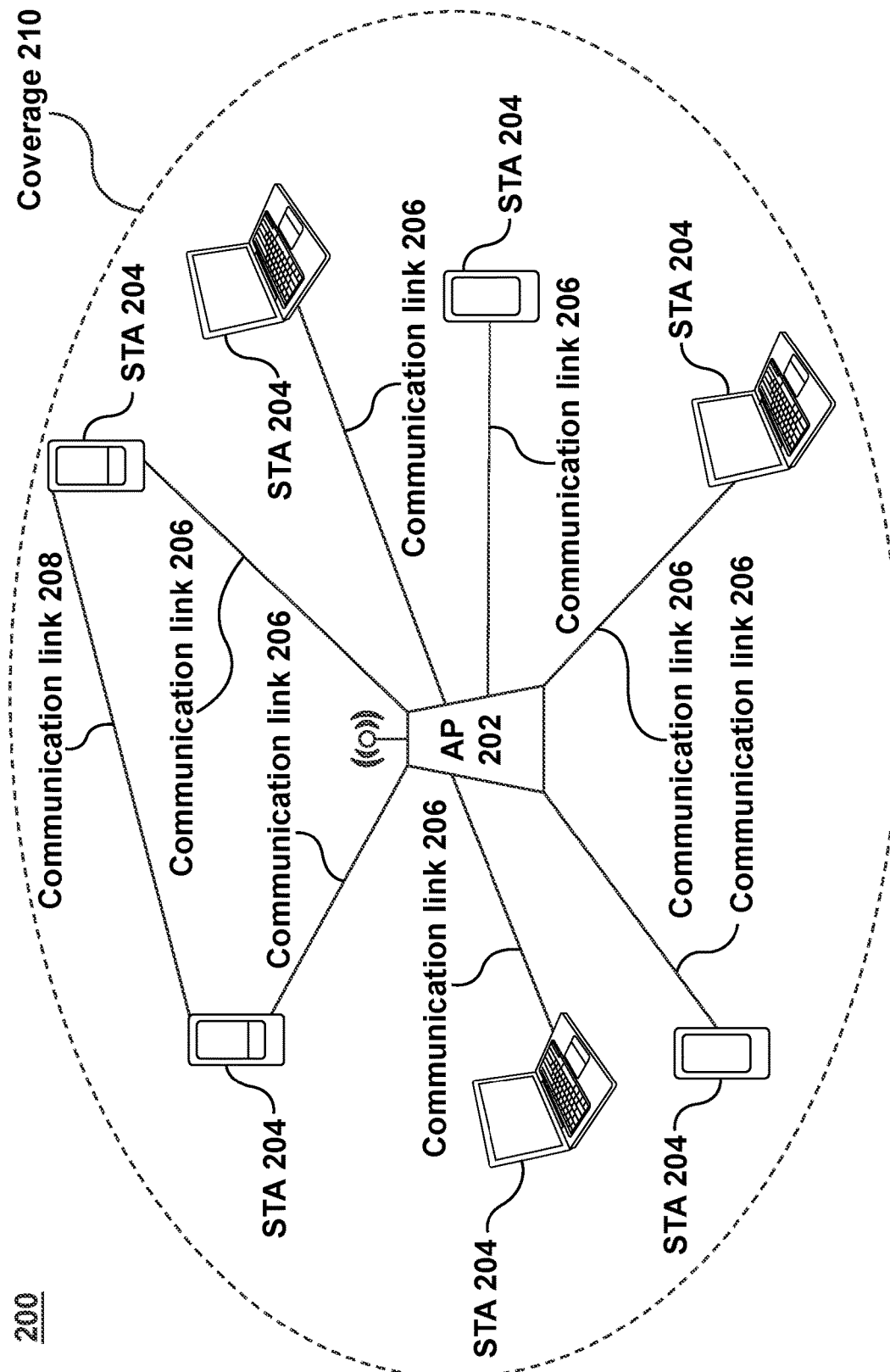
FIG. 8 illustrates an environment of a wireless local area network (WLAN), in accordance with various embodiments of the present disclosure.

FIG. 8 illustrates an environment of a wireless local area network (WLAN) 200, in accordance with various embodiments of the present disclosure. The WLAN 200 may include several wireless devices such as an access point (AP) 202 and multiple associated stations (STAs) 204. Each of the STAs 204 also may be referred to as a mobile station (MS), a mobile device, a mobile handset, a wireless handset, an access terminal (AT), a user equipment (UE), a subscriber station (SS), or a subscriber unit, among other possibilities. The STAs 204 may represent various devices such as mobile phones, personal digital assistant (PDAs), other handheld devices, netbooks, notebook computers, tablet computers, laptops, display devices (for example, TVs, computer monitors, navigation systems, among others), printers or the like. In other words, the STAs 204 may be any electronic device capable wirelessly communicating with other electronic devices and/or AP 202. In certain non-limiting embodiments, the WLAN 200 may be a network implementing at least one of the IEEE 802.11 family of standards.

In certain non-limiting embodiments, each of the STAs 204 may associate and communicate with the AP 202 via a communication link 206. The various STAs 204 in the network are able to communicate with one another through the AP 202. A single AP 202 and an associated set of STAs 204 may be referred to as a basic service set (BSS). FIG. 8 additionally shows an example coverage area 210 of the AP 202, which may represent a basic service area (BSA) of the WLAN 200. While only one AP 202 is shown, the WLAN 200 may include multiple APs 202. An extended service set (ESS) may include a set of connected BSSs. An extended network station associated with the WLAN 200 may be connected to a wired or wireless distribution system that may allow multiple APs 202 to be connected in such an ESS. As such, a STA 204 may be covered by more than one AP 202 and may associate with different APs 202 at different times for different transmissions.

In certain non-limiting embodiments, the STAs 204 may function and communicate (via the respective communication links 206) according to the IEEE 802.11 family of standards and amendments including, but not limited to, 802.11a, 802.11b, 802.11g, 802.11n, 802.11ac, 802.11ad, 802.11ah, 802.11af, 802.11 ay, 802.11ax, 802.11az, 802.11ba, and 802.11be. These standards define the WLAN radio and baseband protocols for the PHY and medium access control (MAC) layers. The STAs 204 in the WLAN 200 may communicate over an unlicensed spectrum, which may be a portion of spectrum that includes frequency bands traditionally used by Wi-Fi technology, such as the 2.4 GHz band, and the 5 GHz band. The unlicensed spectrum may also include other frequency bands, such as the emerging 6 GHz band. The STAs 204 in the WLAN 200 may also be configured to communicate over other frequency bands such as shared licensed frequency bands, where multiple operators may have a license to operate in the same or overlapping frequency band or bands.

In certain non-limiting embodiments, the STAs 204 may form networks without APs 202 or other equipment other than the STAs 204 themselves. One example of such a network is an ad hoc network (or wireless ad hoc network). Ad hoc networks may alternatively be referred to as mesh networks or peer-to-peer (P2P) connections. In some cases, ad hoc networks may be implemented within a larger wireless network such as the WLAN 200. In such implementations, while the STAs 204 may be capable of communicating with each other through the AP 202 using communication links 206, STAs 204 also may communicate directly with each other via direct wireless communication links 208. Additionally, two STAs 204 may communicate via a direct wireless communication link 208 regardless of whether both STAs 204 are associated with and served by the same AP 202. In such an ad hoc system, one or more of the STAs 204 may assume the role filled by the AP 202 in a BSS. Such a STA 204 may be referred to as a group owner (GO) and may coordinate transmissions within the ad hoc network. Examples of direct wireless communication links 208 include Wi-Fi Direct connections, connections established by using a Wi-Fi Tunneled Direct Link Setup (TDLS) link, and other peer-to-peer (P2P) group connections.

In certain non-limiting embodiments, some types of STAs 204 may provide for automated communication. Automated wireless devices may include those implementing internet-of-things (IoT) communication, Machine-to-Machine (M2M) communication, or machine type communication (MTC). IoT, M2M or MTC may refer to data communication technologies that allow devices to communicate without human intervention. For example, IoT, M2M or MTC may refer to communications from STAs 204 that integrate sensors or meters to measure or capture information and relay that information to a central server or application program that may make use of the information or present the information to humans interacting with the program or application.

In certain non-limiting embodiments, WLAN 200 may support beamformed transmissions. As an example, AP 202 may use multiple antennas or antenna arrays to conduct beamforming operations for directional communications with a STA 204. Beamforming (which may also be referred to as spatial filtering or directional transmission) is a signal processing technique that may be used at a transmitter (e.g., AP 202) to shape and/or steer an overall antenna beam in the direction of a target receiver (e.g., a STA 204).

In certain non-limiting embodiments, WLAN 200 may further support multiple-input, multiple-output (MIMO) wireless systems. Such systems may use a transmission scheme between a transmitter (e.g., AP 202) and a receiver (e.g., a STA 204), where both transmitter and receiver are equipped with multiple antennas. For example, AP 202 may have an antenna array with a number of rows and columns of antenna ports that the AP 202 may use for beamforming in its communication with a STA 204. Signals may be transmitted multiple times in different directions (e.g., each transmission may be beamformed differently). The receiver (e.g., STA 204) may try multiple beams (e.g., antenna subarrays) while receiving the signals.

In certain non-limiting embodiments, PPDUs may be transmitted over a radio frequency spectrum band, which in some examples may include multiple sub-bands or frequency channels. In some cases, the radio frequency spectrum band may have a bandwidth of 80 MHz, and each of the sub-bands or channels may have a bandwidth of 20 MHz. Transmissions to and from STAs 204 and APs 202 typically include control information within a header that is transmitted prior to data transmissions. The information provided in a header is used by a receiving device to decode the subsequent data.

Figure 9:
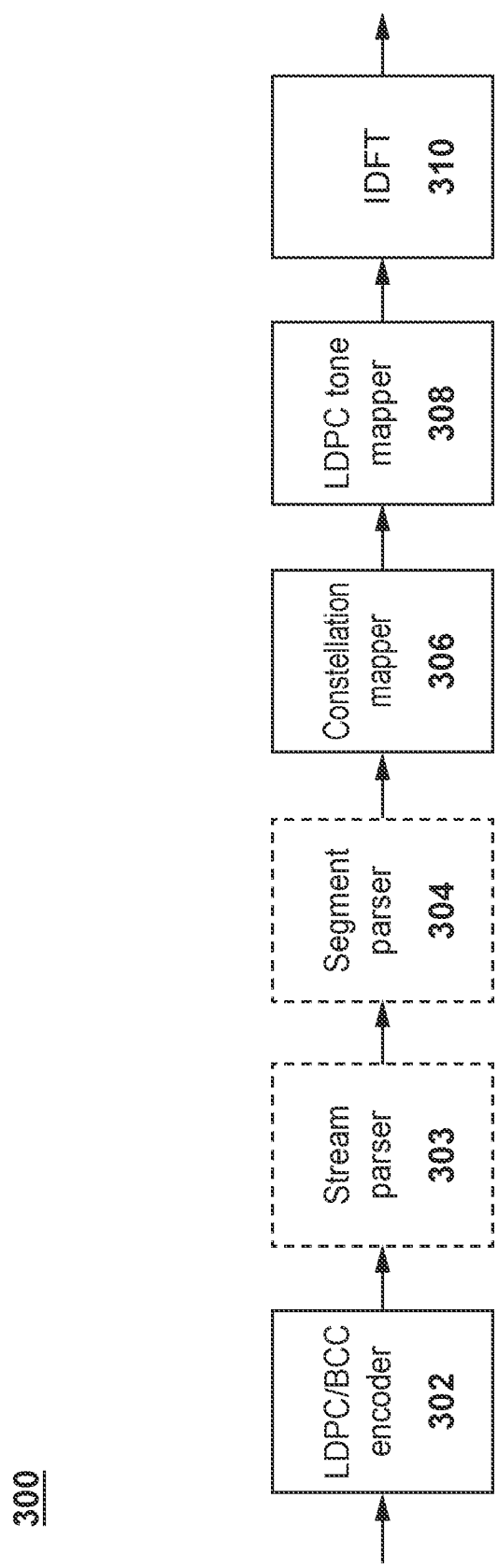
FIG. 9 illustrates a high-level functional block diagram of a portion of a Wi-Fi apparatus, in accordance with various non-limiting embodiments of the present disclosure.

FIG. 9 illustrates a high-level functional block diagram of a portion of a Wi-Fi apparatus 300, in accordance with various non-limiting embodiments of the present disclosure. As shown the Wi-Fi apparatus 300 includes a LDPC/BCC encoder 302, a segment parser 304, a constellation mapper 306, an LDPC tone mapper 308, and inverse discrete Fourier transform (IDFT) module 310. In case where there are multiple encoded data bits to be transmitted in an MIMO system, the Wi-Fi apparatus 300 may include a stream parser 303, multiple segment parsers 304, multiple constellation mappers 306, multiple LDPC tone mappers 308 (if LDPC encoding is deployed), and multiple IDFT modules 310. It is to be noted the Wi-Fi apparatus 300 may include other components such as suitable antenna structure for transmission and reception of wireless signals, memory elements to store certain instructions, processors to execute the instructions. Such components have been omitted from FIG. 9 for the purpose of simplicity. In various non-limiting embodiments, the Wi-Fi apparatus 300 may be incorporated in the STAs 204 and APs 202.

In certain non-limiting embodiments, the LDPC/BCC encoder 302 may be configured to receive data bits and encode data bits to be transmitted over an MRU in the WLAN 200. The encoding of the data bits may be based on LDPC or BCC. The encoded data bits are transmitted to other components of the Wi-Fi apparatus 300 as PPDU.

As previously noted, in case of multiple encoded data bits corresponding to the inputs of the MIMO configuration, the Wi-Fi apparatus 300 may include a stream parser 303. The stream parser 303 may be configured to parse the multiple encoded data bits depending upon the number of spatial streams. By way of an example, if multiple encoded data bits are transmitted over 4 spatial streams, the stream parser 303 may parse the multiple encoded data bits into 4 spatial streams of encoded data bits. Each spatial stream may be processed by in parallel using multiple segment parsers 304, multiple constellation mappers 306, multiple LDPC tone mappers 308, and multiple IDFT modules 310.

It is to be noted that for single spatial stream, the LDPC/BCC encoder 302 may provide the encoded data bits to the segment parser 304 instead of stream parser 303. In case, the PPDU BW is greater than 80 MHz, for example, 160 MHz or 320 MHz, the segment parser 304 may be configured to divide the PPDU BW into multiple 80 MHz subblocks. The segment parser 304 may be used to parse the encoded data bits for RU/MRU. The segment parser 304 may be used to divide those encoded bits (for each spatial stream) into multiple frequency subblocks in a proportional round robin fashion (for large size RUs, a subblock size is 484-tone, (484+242)-tone or 996-tone or the like) as described in Table 3. This operation is bypassed for RUs or MRUs of smaller sizes.

In certain non-limiting embodiments, the segment parser 304 may create a group of the encoded data bits based on a predetermined criterion. The segment parser 304 may determine a number of bits to be grouped together in the group. In other words, the segment parser 304 may determine a number of coded bits per OFDM symbol, $N_{CBPS}$, also referred to as the group of the encoded data bits. The number of number coded bits per OFDM symbol, $N_{CBPS}$, depend on a number of spatial streams, a modulation order, a type of DCM employed and number of times the encoded data subcarriers are to be repeated. The segment parser 304 may parse the encoded bits per spatial stream in a respective group based on a proportional ratio (as previously discussed in table 3) associated with the MRU.

As previously discussed with respect to the conventional Wi-Fi apparatus 100, the DUP mode is adopted in the EHT standard for single RUs only. However, the Wi-Fi apparatus 300 may consider the DUP mode for the cases of the MRUs as well. In other words, the encoded data subcarriers in the MRUs, for example, for (484+242)-, (996+484)-, (996+484+242)-, (2×996+484)-, (3×996)-, or (3×996+484)-tone MRUs may also be duplicated by the Wi-Fi apparatus 300.

Figure 10:
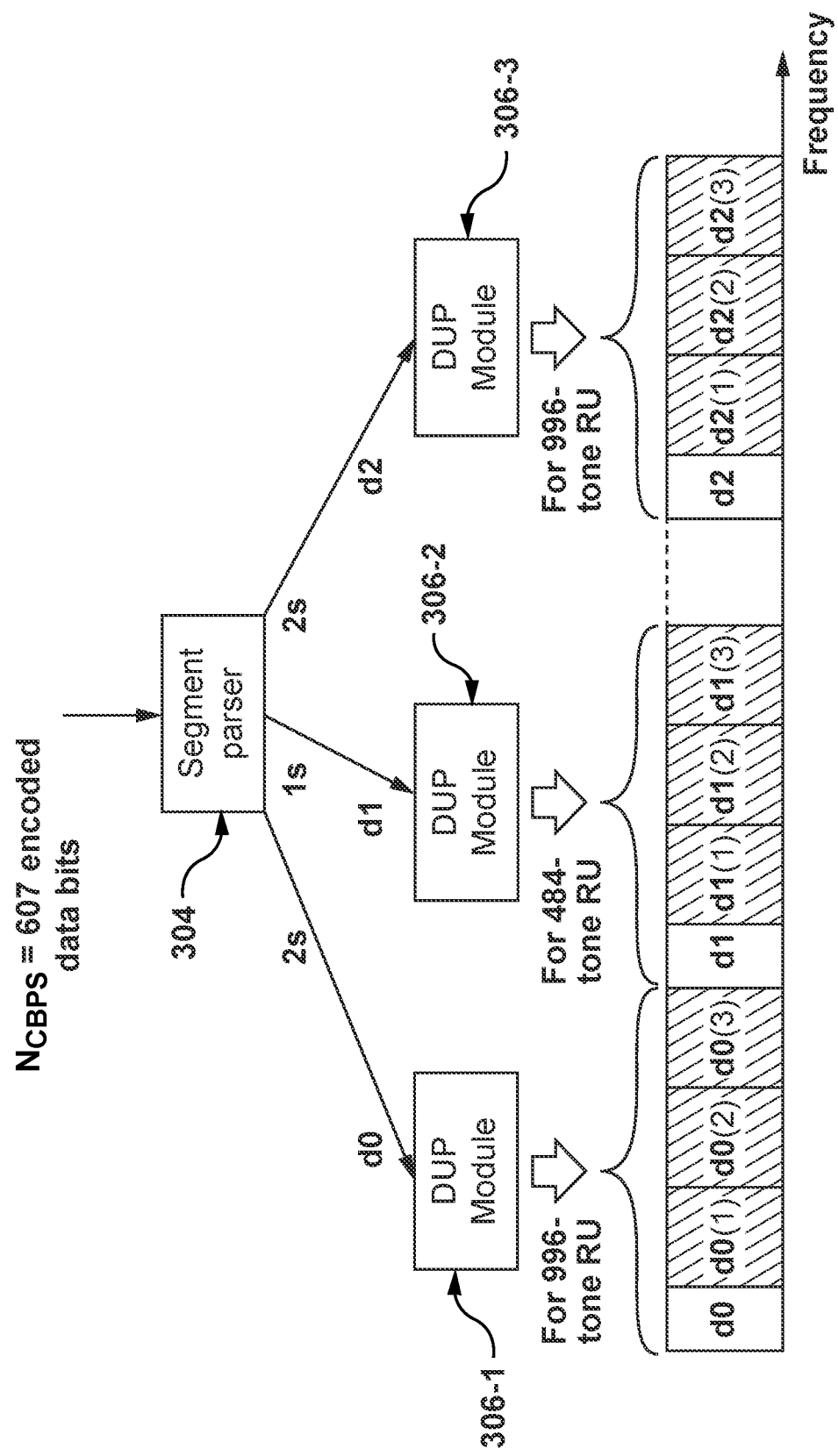
FIG. 10 illustrates an example of DUP mode operation performed by the Wi-Fi apparatus, in accordance with various non-limiting embodiments of the present disclosure.

FIG. 10 illustrates an example of DUP mode operation performed by the Wi-Fi apparatus 300, in accordance with various non-limiting embodiments of the present disclosure. The constellation mapper 306 may further include DUP modules 306-1, 306-2, and 306-3.

In this example, it is considered that the encoded data bits modulated over the subcarriers are to be duplicated 4 times and the MRU selected by the constellation mapper 306 from Table 3 is (996+484+996)-tone MRU. Also, the duplication in this example may be performed without DCM. Based on table 2, the number of data subcarriers $N_{SD}$ is equal to 2428.

Prior to performing the DUP operation, the constellation mapper 306 may be configured to modulate the parsed encoded data bits to generate modulated encoded data symbols by using any suitable modulation technique. Such modulation techniques may include but are not limited to BPSK, QPSK, 16-QAM, 64-QAM, 1024-QAM, and 4096-QAM. By way of an example, a number of bits per modulated encoded data symbols may depend on the type of modulation scheme applied by the constellation mapper 306. The number of bits per modulated encoded data symbols equal to 1 for BPSK; equal to 2 for QPSK; equal to 4 for 16-QAM; equal to 6 for 64-QAM; equal to 10 for 1024-QAM and equal to 12 for 4096-QAM.

Since the data subcarriers are to be duplicated 4 times, the number of data subcarriers $N_{SD}$ may be divided by 4. Thus, the segment parser 304 may group 607 bits for each spatial stream (i.e., 2428 bits divided by 4 for the BPSK modulation) per OFDM symbol based on the predetermined criterion. The predetermined criterion may be to determine a number of data subcarriers $N_{SD}$ associated with the MRU, and determine a number of data subcarriers $N_{SD,DUP}$ by dividing the number of data subcarriers $N_{SD}$ by a number of times the encoded data subcarriers is to be duplicated within the respective RU.

Further, the segment parser 304 may be configured to parse the 607 encoded data bits in accordance with the proportion ratio as defined in table 3 corresponding to the (996+484+996)-tone MRU. In this case, the segment parser 304 may parse the 607 encoded data bits as a first set of 245 encoded data bits, a second set of 117 encoded bits, and a third set of 245 bits. The segment parser 304 may provide the first set of 245 encoded data bits, the second set of 117 encoded bits, and the third set of 245 encoded data bits to the constellation mapper 306.

Considering BPSK modulation technique, the constellation mapper 306 may be configured to modulate the first set of 245 encoded data bits to generate a first set of 245 encoded data symbols. The constellation mapper 306 may be configured to map the first 245 encoded data symbols to the data subcarriers to generate encoded data subcarriers $d_0$.

On the similar lines, the constellation mapper 306 may be configured to generate encoded data subcarriers $d_1$ corresponding to the second set of 117 encoded data bits and generate encoded data subcarriers $d_2$ corresponding to the third set of 245 encoded data bits. The encoded data subcarriers $d_0$ may be associated with the 996-tone RU, the encoded data subcarriers $d_1$ may be associated with the 484-tone RU, the encoded data subcarriers $d_2$ may be associated with the 996-tone RU.

Further, the constellation mapper 306 may be configured to duplicate the encoded data subcarriers $d_0$, $d_1$, and $d_2$ within the 996-tone RU, 484-tone RU, and 996-tone RU respectively. To do so, the constellation mapper 306 may provide the 245 encoded data subcarriers $d_0$ to the DUP module 306-1, 117 encoded data subcarriers $d_1$ to the DUP module 306-2, and 245 encoded data subcarriers $d_2$ to the DUP module 306-3.

The DUP module 306-1 may be configured to duplicate the 245 encoded data subcarriers $d_0$ 4 times over a bandwidth of 80 MHz associated with the 996-tone RU. The duplicate encoded data subcarriers may be represented as $d_0(1)$, $d_0(2)$, and $d_0(3)$. The DUP module 306-2 may be configured to duplicate the 117 encoded data subcarriers $d_1$ 4 times over a bandwidth of 40 MHz associated with the 484-tone RU. The duplicate encoded data subcarriers may be represented as $d_1(1)$, $d_1(2)$, and $d_1(3)$. The DUP module 306-3 may be configured to duplicate the 245 encoded data subcarriers $d_2$ 4 times over a bandwidth of 80 MHz associated with the 996-tone RU. The duplicate encoded data subcarriers may be represented as $d_2(1)$, $d_2(2)$, and $d_2(3)$. It is to be noted that the DUP module 306-1, 306-2, and 306-3 may be configured to duplicate the encoded data subcarriers $d_0$, $d_1$, and $d_2$ without performing the DCM operation over the encoded data subcarriers $d_0$, $d_1$, and $d_2$.

Figure 11:
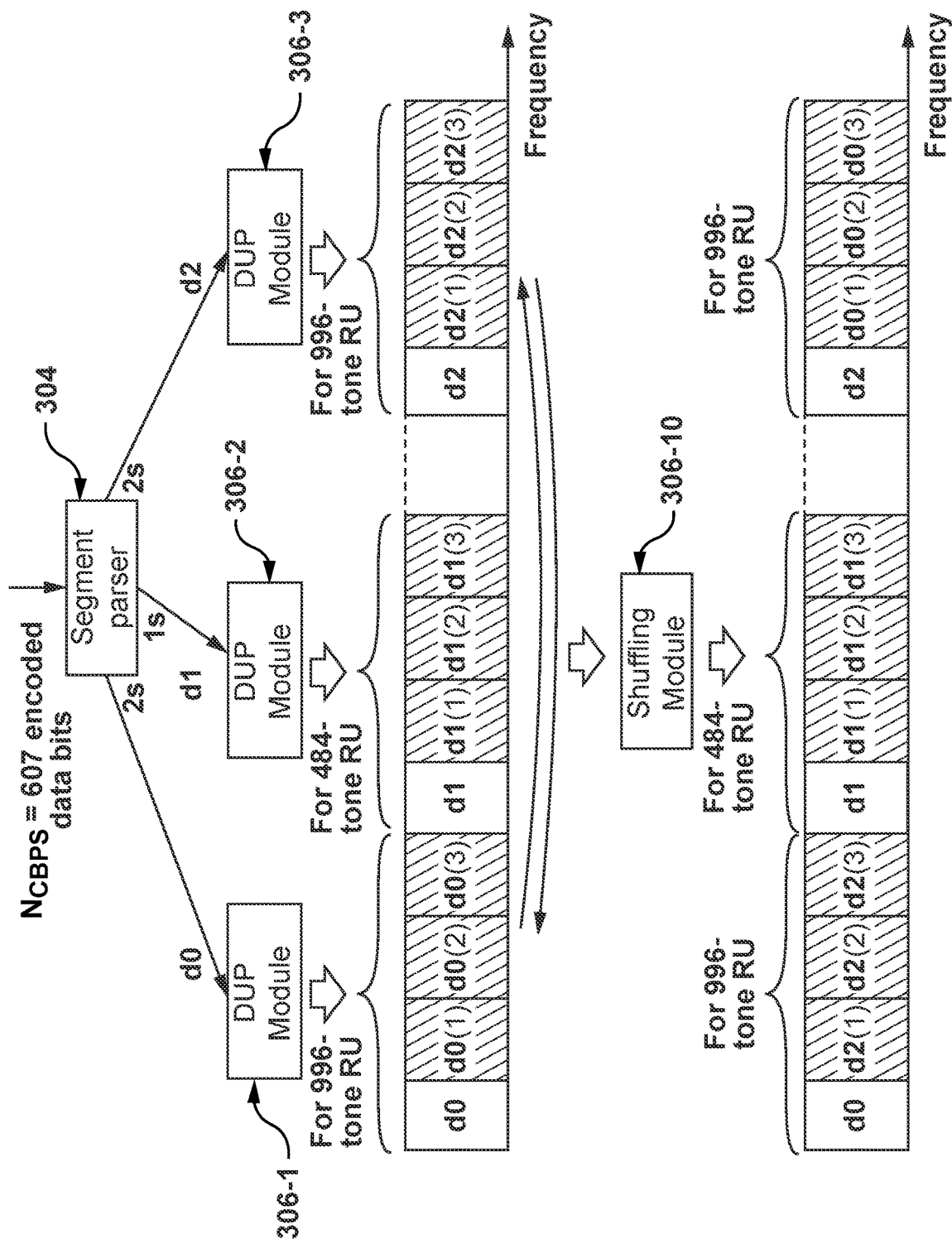
FIG. 11 illustrates an example of shuffling operation performed by the Wi-Fi apparatus, in accordance with various non-limiting embodiments of the present disclosure.

In addition to duplicating the encoded data subcarriers within the RUs of the (996+484+996)-tone MRU, in certain non-limiting embodiments, the constellation mapper 306 may be configured to shuffle the encoded data subcarriers across the RUs. To this end, the constellation mapper 306 may include a shuffling module 306-10 (as shown in FIG. 11) configured to shuffle the encoded data subcarriers. FIG. 11 illustrates an example of shuffling operation performed by the Wi-Fi apparatus 300, in accordance with various non-limiting embodiments of the present disclosure. As shown, the shuffling module 306-10 may be configured to shuffle the duplicate encoded data subcarriers $d_0(1)$, $d_0(2)$, and $d_0(3)$ and duplicate encoded data subcarriers $d_2(1)$, $d_2(2)$, and $d_2(3)$.

The shuffling module 306-10 may apply phase rotations to the duplicate encoded data subcarriers $d_0(1)$, $d_0(2)$, $d_0(3)$, $d_2(1)$, $d_2(2)$, and $d_2(3)$. By way of an example, the phase rotation may be applied to each replica $d_l(i)$ to reduce peak-to-average power ratio. In general, the duplicate encoded data subcarriers may be represented as $d_l(i)$, where l is the index of 80 MHz subblock and i is the index of duplicate the encoded data subcarriers within the lth subblock. Also, the original encoded data subcarriers may be represented as $d_l$. The shuffling module 306-10 may be configured to apply a phase rotation to at least some of the duplicate encoded data subcarriers $d_l(i)$.

It is to be noted that, in various non-limiting embodiments, a shuffling of the duplicate encoded data subcarriers $d_l(i)$ across 80 MHz subblocks may be configurable. In other words, an indication may be included in a subfield of a PHY header of PPDU to link the duplicate encoded data subcarriers $d_l(i)$ to the original data subcarriers $d_l$ after shuffling. This would assist a receiver (not illustrated) to identify the duplicate encoded data subcarriers $d_l(i)$ and link them to the original data subcarriers $d_l$ for properly decoding the encoded data bits.

It is to be noted that the above example is corresponding to duplicating the encoded data subcarriers 4 times over the (996+484+996)-tone MRU. Also, three DUP modules 306-1, 306-2, and 306-3 have been illustrated to duplicate the encoded data subcarriers. However, in other non-limiting embodiments, the encoded data subcarriers may be duplicated by some other factors for example 3 times or 5 times. Also, a different MRU may be selected based on PPDU BW and accordingly the number of DUP modules may be varied. By way of an example, if the MRU is a (484+996)-tone MRU, the constellation mapper 306 may have 2 DUP modules. Similarly, if the MRU, is a (996+484+996+996)-tone MRU, the constellation mapper 306 may have 4 DUP modules.

Thus, by virtue of duplication operation, the Wi-Fi apparatus 300 may improve the spectrum usage efficiency. At the same time, the Wi-Fi apparatus 300 may improve the frequency diversity gain by shuffling the duplicate encoded data subcarriers $d_l(i)$. Also, the Wi-Fi apparatus 300 may improve the resistance against the interference from overlapped basic service set (OBSS).

Table 5 provides values of $N_{SD}$ without DCM and duplication as adopted by the EHT standard for single RUs only. Also, Table 5 provides values of $N_{SD,DUP}$ (number of data subcarriers in DUP mode, in accordance with various non-limiting embodiments of the present disclosure) without DCM but with duplication of encoded data subcarriers in single RUs. In other words, referring to FIG. 10, $N_{SD,DUP}$ may represent a total number of subcarriers in the encoded data subcarriers $d_0$, $d_1$, and $d_2$. It is to be noted that although the EHT standard has adopted duplication over large size RUs such as 996-tone, 2×996-tone, and 4×996-tone RUs, however, it does not provide the $N_{SD,DUP}$ without DCM corresponding to the smaller RU sizes, such as, 242-tone and 484-tone. Such values are provided by the present disclosure, such as for RU size of 242 Also, the value of $N_{SD}$ corresponding to the 996-tone RU as adopted by the EHT standard is 234. Whereas, the value of the $N_{SD,DUP}$ corresponding to the 996-tone RU as disclosed by the present disclosure is 245. It is to be noted that the values of $N_{SD,DUP}$ are corresponding to duplication of the data subcarriers by a factor of 4. However, the values of $N_{SD,DUP}$ for different size of RUs may change with change in duplication factor other than 4.

TABLE 5

| | RU size | | | | |
| --- | --- | --- | --- | --- | --- |
| | 242 | 484 | 996 | 2 × 996 | 4 × 996 |
| $N_{SD}$ without DCM and duplication (EHT standard) | 234 | 468 | 980 | 1960 | 3920 |
| $N_{SD, DUP} = [N_{SD}/4]$ | 58 | 117 | 234(EHT standard) 245 | 490(EHT standard) | 980 (EHT standard) |

As previously noted, the EHT standard does not provide an option to duplicate the encoded data subcarriers over the MRUs. However, in certain non-limiting embodiments, the Wi-Fi apparatus 300 may be configured to duplicate the encoded data subcarriers over the MRUs. In case of MRUs, the conventional Wi-Fi apparatus 100 uses the only values of $N_{SD}$ (without DCM) as provided by the EHT standard and shown in Table 6.

Also, Table 6 provides values of $N_{SD,DUP}$ (number of data subcarriers in DUP mode for MRUs, in accordance with various non-limiting embodiments of the present disclosure) without DCM but with duplication of the encoded data subcarriers over MRUs such as over (484+242)-, (996+484)-, (996+484+242)-, (2×996+484)-, (3×996)-, or (3×996+484)-tone MRUs, in accordance with various non-limiting embodiments of the present disclosure. It is to be noted that the values of $N_{SD,DUP}$ are corresponding to duplication of the data subcarriers by a factor of 4. However, the values of $N_{SD,DUP}$ for different size of MRUs may change with changes in duplication factors other than 4.

TABLE 6

| MRU size | 484 + 242 | 996 + 484 | 996 + 484 + 242 | 2 × 996 + 484 | 3 × 996 | 3 × 996 + 484 |
|---|---|---|---|---|---|---|
| $N_{SD}$ (without DCM) (EHT standard) | 702 | 1448 | 1682 | 2428 | 2940 | 3408 |
| $N_{SD, DUP} = [N_{SD}/4]$ | 175 | 362 | 420 | 607 | 735 | 852 |

It is to be noted that the selection of the RUs/MRUs may depend on system requirements and in different embodiments, different RUs/MRUs may be used depending on the requirements. To this end, the operational parameters of the Wi-Fi apparatus 300 may vary accordingly. Starting with the number of encoded bits for each spatial stream per OFDM symbol may be represented as $N_{SD,DUP} \times M$. M is the modulation order (a number of bits per constellation symbol), i.e., M=1 for BPSK; M=2 for QPSK; M=4 for 16-QAM; M=6 for 64-QAM; M=10 for 1024-QAM and M=12 for 4096-QAM. The value of $N_{SD,DUP}$ may be selected from Table 5 or 6 based on the RU or MRU size.

Figure 12:
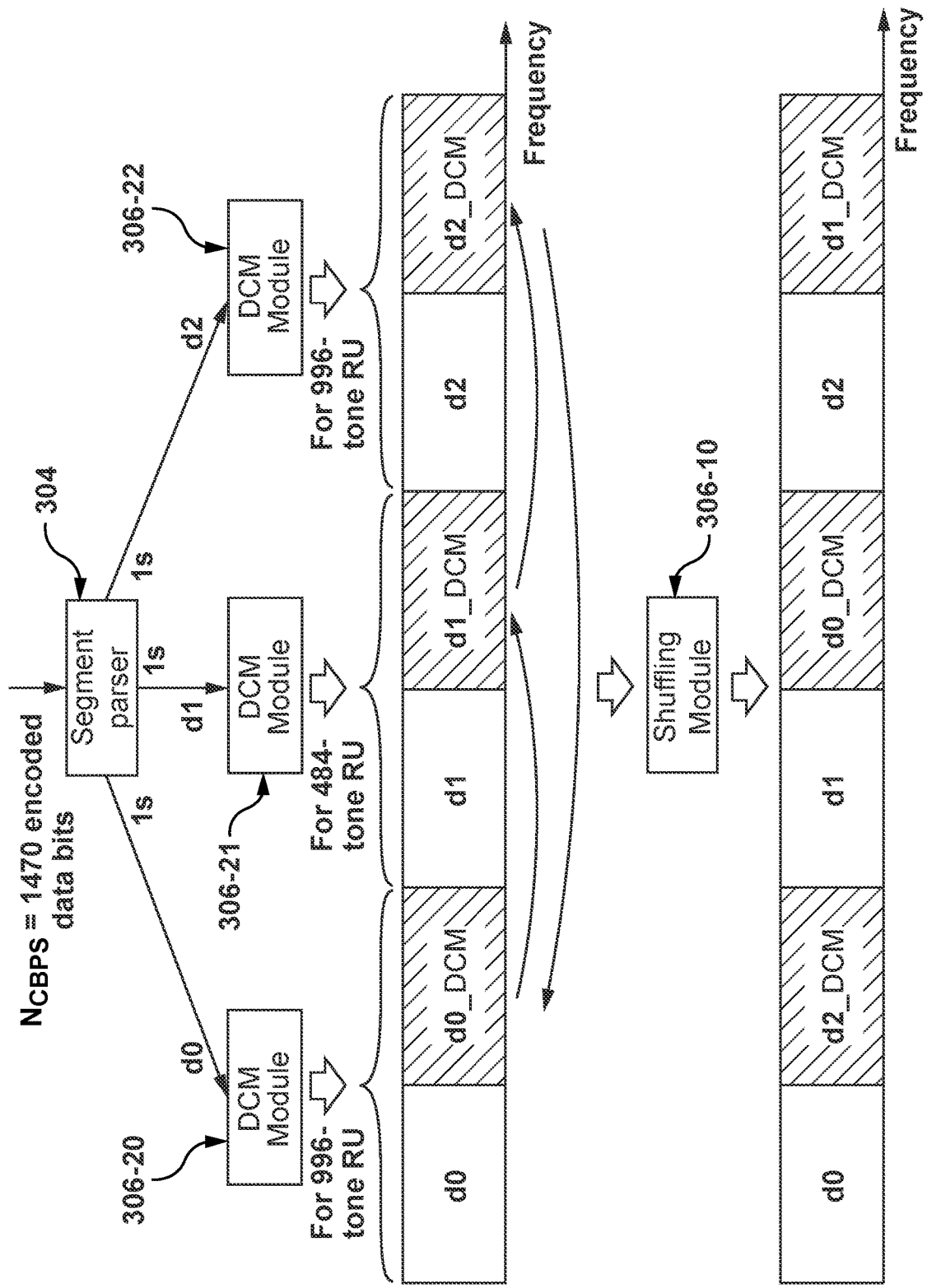
FIG. 12 illustrates an example of a modified DCM operation performed by the Wi-Fi apparatus over 3×996-tone RU, in accordance with various non-limiting embodiments of the present disclosure.

Further, the Wi-Fi apparatus 300 may be configured to provide an improved technique for performing DCM over RUs/MRUs as compared to the DCM being performed by the conventional Wi-Fi apparatus 100. The Wi-Fi apparatus 300 may perform DCM mapping onto subblocks (particularly for large BWs of 160 and 320 MHz that include more than one 80 MHz subblocks). FIG. 12 illustrates an example of a modified DCM operation performed by the Wi-Fi apparatus 300 over 3×996-tone RU, in accordance with various non-limiting embodiments of the present disclosure.

In certain non-limiting embodiments, the constellation mapper 306 may further include DCM modules 306-20, 306-21, and 306-22. The DCM module 306-20, 306-21, and 306-22 may be configured to perform DCM over the encoded data subcarriers as provided by the constellation mapper 306 to generate DCM-encoded data subcarriers. Before performing the DCM, in certain non-limiting embodiments, the segment parser may be configured to create a group of the encoded data subcarriers in accordance with a predetermined criterion. The predetermined criterion may be to determine the number of data subcarriers $N_{SD}$ associated with the MRU, and determine a number of data subcarriers $N_{SD,DUP}$, which in this case may also be referred to as $N_{SD,DCM}$, by dividing the number of data subcarriers $N_{SD}$ by a number of times the encoded data subcarriers is to be duplicated within the respective RU. In certain non-limiting embodiments, while performing DCM over the encoded data subcarriers, the encoded data subcarriers may be duplicated two times. To this end, the number of data subcarriers $N_{SD,DCM}$ may be determined by dividing the number of data subcarriers $N_{SD}$ by 2. Also, a number of encoded data bits in the group for each spatial stream is equal to $M \times N_{SD,DCM}$, where M is the order of modulation.

By way of an example, for 3×996-tone RU, the segment parser 304 determines that the number of data subcarriers $N_{SD}$ associated with 3×996-tone RU as 2940. The segment parser then determine the number of data subcarriers $N_{SD,DUP}$ by dividing the 2940 by 2 which gives 1470 encoded data bits per group for each spatial stream (given that the modulation is BPSK and the value of M=1) to three equal subgroups of encoded data bits. The constellation mapper 306 may be configured to generate subgroups of encoded data subcarriers represented as $d_0, d_1, d_2$ based on the three equal subgroups of encoded data bits. The subgroup $d_0$ is provided to DCM module 306-20, subgroup $d_1$ is provided to DCM module 306-21, and subgroup $d_2$ is provided to DCM module 306-22. The DCM modules 306-20, 306-21, and 306-22 may be implemented on the constellation mapper 306 as sub-modules. As illustrated, the DCM modules 306-20, 306-21, and 306-22 may perform DCM (in a similar manner previously discussed) separately within each RU of the 3×996-tone RU. The DCM-encoded data subcarriers corresponding to encoded data subcarriers as $d_0, d_1, d_2$ may be represented as $d_{0DCM}, d_{1DCM}, d_{2DCM}$ respectively.

It is to be noted that the encoded data subcarriers as $d_0, d_1, d_2$ and the corresponding DCM-encoded data subcarriers $d_{0DCM}, d_{1DCM}, d_{2DCM}$ may occupy equal spectrum width of single RUs. For example, since the encoded data subcarriers as $d_0$ and the DCM-encoded data subcarriers $d_{0DCM}$ are associated with the 996-tone RU, each of the $d_0$, and $d_{0DCM}$ may occupy a same spectrum width of 40 MHz. Also, the number of encoded data subcarriers associated with the $d_0$, $d_1$, $d_2$ may be equal to the number of data subcarriers associated with the $d_{0DCM}, d_{1DCM}, d_{2DCM}$ respectively.

In the example of FIG. 12, given that no duplication operation is performed on the encoded data subcarriers as $d_0$, $d_1$, $d_2$ and the corresponding DCM-encoded data subcarriers $d_{0DCM}, d_{1DCM}, d_{2DCM}$, the shuffling module 306-10 may be configured to shuffle the DCM-encoded data subcarriers $d_{0DCM}, d_{1DCM}, d_{2DCM}$ among other subblocks as shown in FIG. 12.

The shuffling module 306-10 may be configured to shuffle the DCM-encoded data subcarriers by applying phase rotations to the original encoded data subcarriers $d_0$, $d_1$, $d_2$ and/or the DCM-encoded data subcarriers $d_{0DCM}, d_{1DCM}, d_{2DCM}$. In general, the DCM-encoded data subcarriers $d_{0DCM}, d_{1DCM}, d_{2DCM}$ may be represented as $d_{lDCM}$, where l is the index of 80 MHz subblock. Also, the original encoded data subcarriers may be represented as $d_l$. The shuffling module 306-10 may be configured to apply a phase rotation to at least some of the DCM-encoded data subcarriers $d_{lDCM}$.

Figure 13:
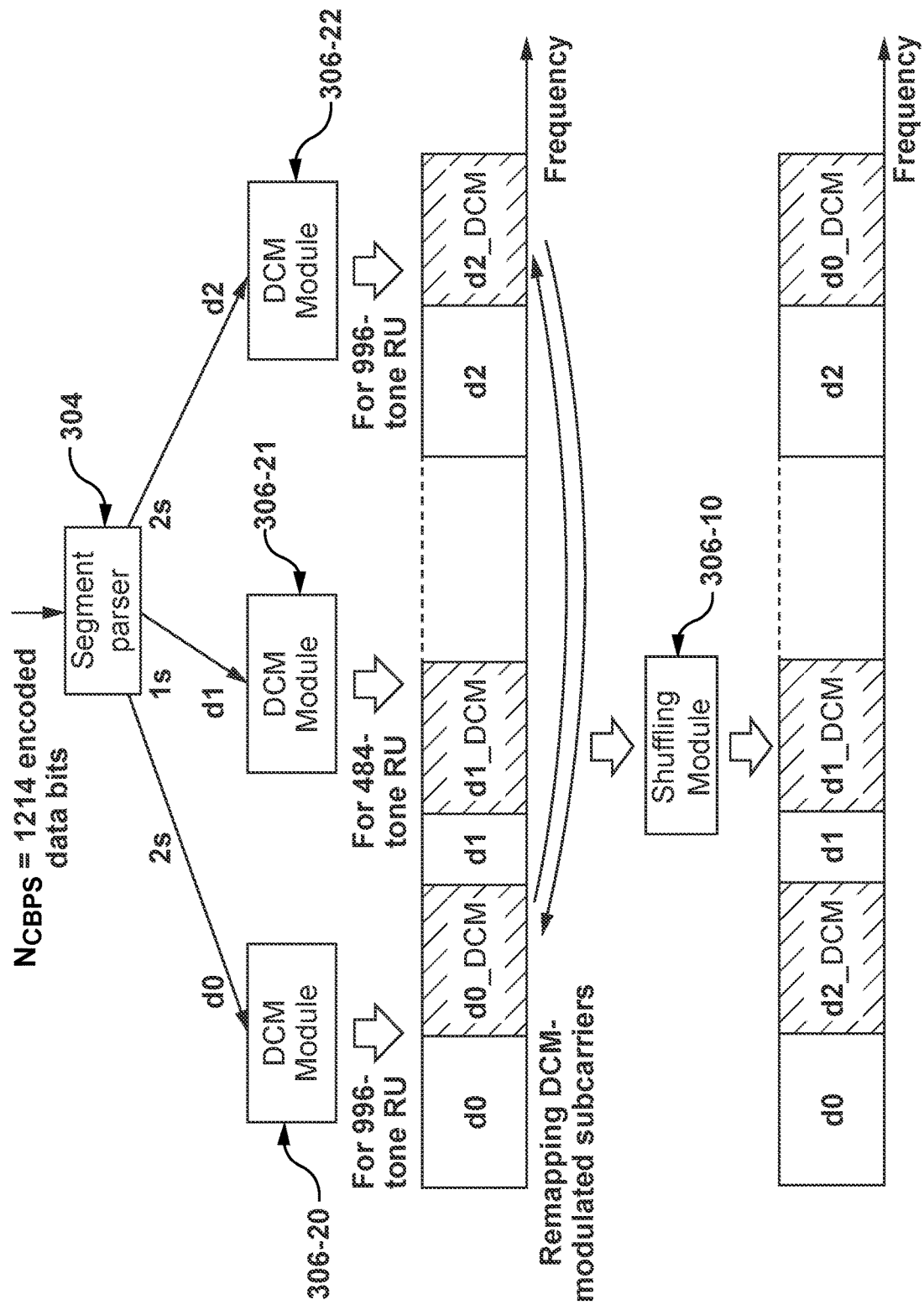
FIG. 13 illustrates another example of a modified DCM operation performed by the Wi-Fi apparatus over (996+484+996)-tone MRU, in accordance with various non-limiting embodiments of the present disclosure.

FIG. 13 illustrates another example of a modified DCM operation performed by the Wi-Fi apparatus 300 over (996+ 484+996)-tone MRU, in accordance with various non-limiting embodiments of the present disclosure. In this example, the segment parser 304 may distribute $$\frac{2428}{2} = 1214$$

encoded data bits tor each spatial stream per OFDM symbol in accordance with proportional ratio as described in Table 3. The constellation mapper 306 may be configured to generate subgroups of encoded data subcarriers represented as $d_0, d_1, d_2$. The DCM modules 306-20, 306-21, and 306-22 may perform DCM (in a similar manner previously discussed) separately within each RU of the (996+484+996)- tone MRU. The DCM-encoded data subcarriers corresponding to encoded data subcarriers as $d_0$, $d_1$, $d_2$ may be represented as $d_{0DCM}$, $d_{1DCM}$, $d_{2DCM}$ respectively.

It is to be noted that in case of (996+484+996)-tone MRU or any other MRU, the DCM-encoded data subcarriers $d_{0DCM}$, $d_{1DCM}$, $d_{2DCM}$ may not be occupying a same spectrum width. By way of an example, the DCM-encoded data subcarriers $d_{0DCM}$ and $d_{2DCM}$ are associated with 996-tone RU and hence, each may occupy a spectrum width of 40 MHz. However, the DCM-encoded data subcarriers $d_{1DCM}$ is associated with 484-tone RU and hence, it may occupy a spectrum width of 20 MHz. In other words, the number of encoded data subcarriers associated with the $d_0$, $d_2$ may not be equal to the number of data subcarriers associated with the $d_1$. Also, the number of encoded data subcarriers associated with the $d_{0DCM}$, $d_{2DCM}$ may not be equal to the number of data subcarriers associated with the $d_{1DCM}$. To this end, in this case, the shuffling module 306-10 may be configured to shuffle only the DCM-encoded data subcarriers $d_{0DCM}$ and $d_{2DCM}$.

Regardless of that, the shuffling operation may increase the diversity gain and the resistance against the interference from overlapped basic service set (OBSS). However, to further improve the frequency diversity, instead of performing an equal full size DCM, i.e., the size of encoded data subcarriers as $d_0$ being equal to the size of the DCM-encoded data subcarriers as $d_{0DCM}$, the DCM modules 306-20 and 306-22 may perform partial size DCM mapping. In other words, the DCM modules 306-20 and 306-22 may perform DCM in a manner that the number DCM-encoded data subcarriers $d_{0DCM}$ and $d_{2DCM}$ are divided into two equal half as shown in FIG. 14.

Figure 14:
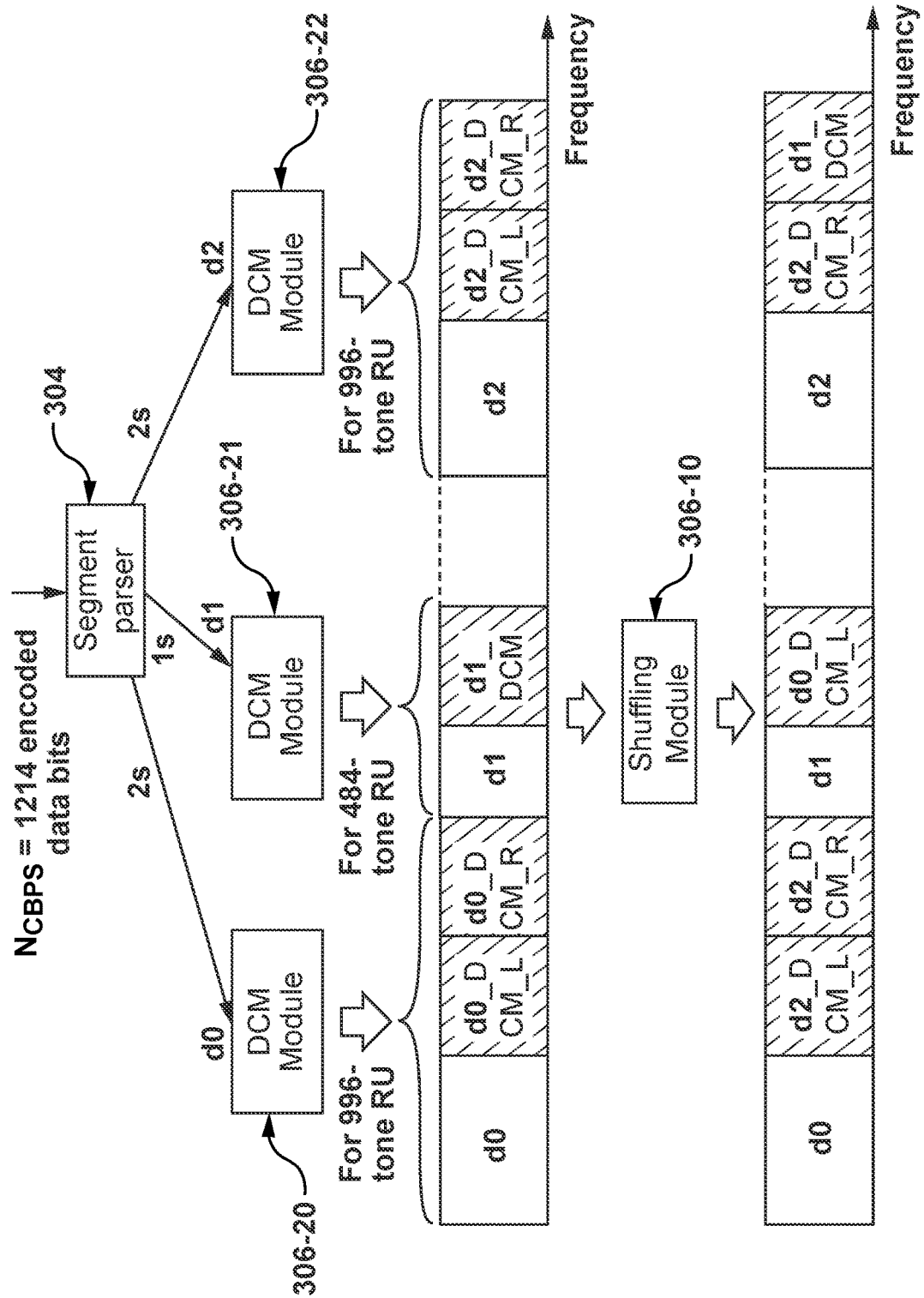
FIG. 14 illustrates another example of a modified DCM operation performed by the Wi-Fi apparatus over (996+484+996)-tone MRU, in accordance with various non-limiting embodiments of the present disclosure.

FIG. 14 illustrates another example of a modified DCM operation performed by the Wi-Fi apparatus 300 over (996+484+996)-tone MRU, in accordance with various non-limiting embodiments of the present disclosure. In this example, the DCM module 306-20 perform DCM operation over the encoded data subcarriers $d_0$ to generate DCM-encoded data subcarriers $d_{0DCML}$ and $d_{0DCMR}$, in which the labels L and R respectively designate arbitrary "left" and "right" halves of $d_{0DCM}$. The spectrum width occupied by the DCM-encoded data subcarriers $d_{0DCML}$ and $d_{0DCMR}$ is equal to 20 MHz each. Similarly, the DCM module 306-20 perform DCM operation over the encoded data subcarriers $d_2$ to generate DCM-encoded data subcarriers $d_{2DCML}$ and $d_{2DCMR}$. The spectrum width occupied by the DCM-encoded data subcarriers $d_{2DCML}$ and $d_{2DCMR}$ is equal to 20 MHz each. As a result, the shuffling module 301-10 may perform shuffling operation on all of the DCM-encoded data subcarriers $d_{0DCML}$, $d_{0DCMR}$, $d_{1DCM}$, $d_{2DCML}$ and $d_{2DCMR}$ as shown in FIG. 14.

It is to be noted that the above examples three DCM modules 302-20, 306-21, and 306-22 have been illustrated. However, in other non-limiting embodiments, the number of DCM modules may be varied. By way of an example, if the MRU is a (484+996)-tone MRU, the constellation mapper 306 may have 2 DCM modules. Similarly, if the MRU, is a (996+484+996+996)-tone MRU, the constellation mapper 306 may have 4 DCM modules.

By virtue of modified DCM operation, the Wi-Fi apparatus 300 may improve the frequency diversity gain by shuffling the DCM-encoded data subcarriers $d_{iDCM}$. Also, the Wi-Fi apparatus 300 may improve the resistance against the interference from overlapped basic service set (OBSS).

Figure 15:
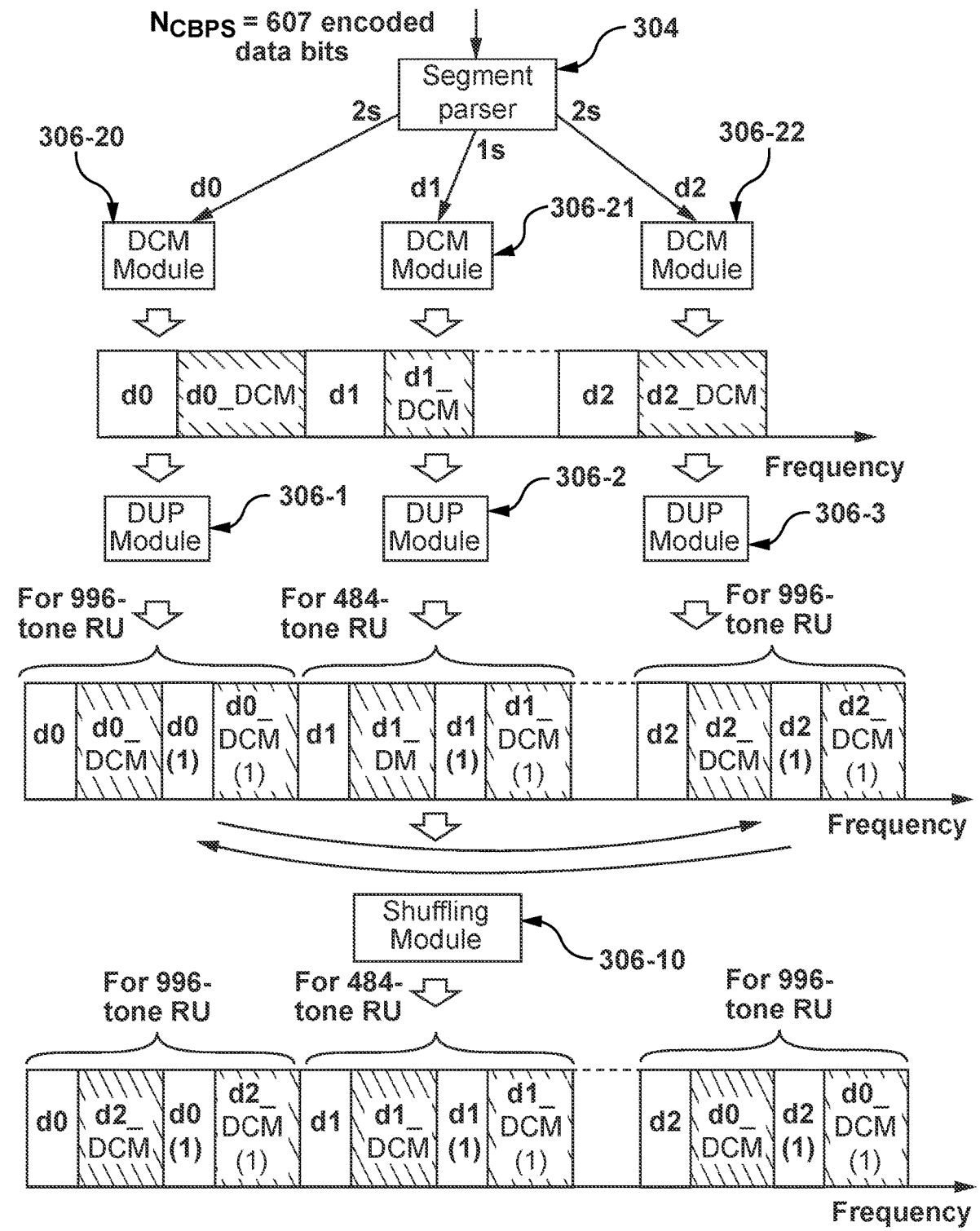
FIG. 15 illustrates an example of a modified DCM operation as well as DUP mode operation performed by the by the Wi-Fi apparatus over (996+484+996)-tone MRU, in accordance with various non-limiting embodiments of the present disclosure.

In certain non-limiting embodiments, the Wi-Fi apparatus 300 may be configured to perform DCM as well as DUP operations, with or without shuffling operation. FIG. 15 illustrates an example of a modified DCM operation as well as DUP mode operation performed by the Wi-Fi apparatus 300 over (996+484+996)-tone MRU, in accordance with various non-limiting embodiments of the present disclosure. In this example, it is assumed that the encoded data subcarriers are to be repeated 4 times. The repetition includes DCM-encoded data subcarriers as well. In other words, the encoded data subcarrier $d_0$ and the DCM-encoded data subcarrier $d_{DCM}$ are repeated once resulting in 4 copies.

Also, in the above example it is assumed that the DCM is based on a BPSK scheme hence the module order (a number of bits per constellation symbol) is equal to 1. In order to cater to the modified DCM operation and the DUP operation while respecting data subcarrier capacity of (996+484+996)-tone MRU, the number of encoded bits for each spatial stream per OFDM symbol for (996+484+996)-tone MRU is equal to 607.

The segment parser 304 may be configured to parse the 607 encoded data bits in accordance with the proportion ratio as defined in Table 3 corresponding to the (996+484+996)-tone MRU. The constellation mapper 306 may be configured to modulate the encoded data bits to generate modulated encoded data symbols and maps the modulated data symbols to generate encoded data subcarriers. In this case, the constellation mapper 306 may provide 245 encoded data subcarriers $d_0$ to the DCM module 306-20, 117 encoded data subcarriers $d_1$ to the DUP module 306-21, and 245 encoded data subcarriers $d_2$ to the DUP module 306-22.

The DCM module 306-20 may be configured to perform DCM operation over the encoded data subcarriers $d_0$ to generate DCM-encoded data subcarriers $d_{0DCM}$. It is to be noted that although the bandwidth of the 996-tone RU is 80 MHz, however, the encoded data subcarriers $d_0$ and the DCM-encoded data subcarriers $d_{0DCM}$ may have a bandwidth of 20 MHz each, so that the remaining bandwidth may be utilized for DUP operation.

In a similar manner, the DCM module 306-21 may be configured to perform DCM operation over the encoded data subcarriers $d_1$ to generate DCM-encoded data subcarriers $d_{1DCM}$. It is to be noted that although the spectrum width occupied by the 484-tone RU is 40 MHz, the encoded data subcarriers $d_1$ and the DCM-encoded data subcarriers $d_{1DCM}$ may occupy a spectrum width of 10 MHz each, so that the remaining spectrum width may be utilized for DUP operation.

Also, the DCM module 306-22 may be configured to perform DCM operation over the encoded data subcarriers $d_2$ to generate DCM-encoded data subcarriers $d_{2DCM}$. The encoded data subcarriers $d_2$ and the DCM-encoded data subcarriers $d_{2DCM}$ may occupy a spectrum width of 20 MHz each.

The DUP module 306-1 may be configured to perform DUP operation to duplicate the encoded data subcarriers $d_0$ and the DCM-encoded data subcarriers $d_{0DCM}$ in the 996-tone RU. The duplicate encoded data subcarriers $d_0$ and the duplicate DCM-encoded data subcarriers $d_{0DCM}$ may be represented as $d_0(1)$ and $d_{0DCM}(1)$, respectively.

The DUP module 306-2 may be configured to perform DUP operation to duplicate the encoded data subcarriers $d_1$ and the DCM-encoded data subcarriers $d_{1DCM}$ in the 484-tone RU. The duplicate encoded data subcarriers $d_1$ and the duplicate DCM-encoded data subcarriers $d_{1DCM}$ may be represented as $d_1(1)$ and $d_{1DCM}(1)$, respectively.

Similarly, the DUP module 306-3 may be configured to perform DUP operation to duplicate the encoded data subcarriers $d_2$ and the DCM-encoded data subcarriers $d_{2DCM}$ in the 996-tone RU. The duplicate encoded data subcarriers $d_2$ and the duplicate DCM-encoded data subcarriers $d_{2DCM}$ may be represented as $d_2(1)$ and $d_{2DCM}(1)$, respectively.

In order to further improve the spectrum usage efficiency, improve the frequency diversity gain, and improve the resistance against the interference from overlapped basic service set (OBSS), in certain non-limiting embodiments, the shuffling module 310-10 may be configured to shuffle the DCM-encoded data subcarriers $d_{0DCM}$, $d_{1DCM}(1)$, $d_{2DCM}$, and $d_{2DCM}(1)$.

It is to be noted that in this case DCM-encoded data subcarriers $d_{1DCM}$ and $d_{2DCM}(1)$ were not involved in shuffling process as the associated spectrum width is different from the DCM-encoded data subcarriers $d_{0DCM}$, $d_{1DCM}(1)$, $d_{2DCM}$, and $d_{2DCM}(1)$.

It is to be noted that, in various non-limiting embodiments, a shuffling of the duplicate encoded data subcarriers $d_I(i)$ and the duplicate DCM-encoded data subcarriers $d_{IDCM}(i)$ across 80 MHz subblocks may be configurable. In other words, an indication may be included in a subfield of a PHY header of PPDU to link the duplicate encoded data subcarriers $d_I(i)$ and the duplicate DCM-encoded data subcarriers $d_{IDCM}(i)$ to the original data subcarriers $d_I$ after shuffling. This would assist a receiver (not illustrated) to identify the duplicate encoded data subcarriers $d_I(i)$ and the duplicate DCM-encoded data subcarriers $d_{IDCM}(i)$ and link them to the original data subcarriers $d_I$ for properly decoding the encoded data bits.

In addition to the above examples and embodiments, if the LDPC/BCC encoder 302 may encode the received data bits based on LDPC, the LDPC tone mapper 308 may be configured to perform LDPC tone mapping after constellation mapping and DCM (if DCM is applicable) performed by the constellation mapper 306. In case DCM is performed, the LDPC tone mapper 308 may apply permuting to two parts of data subcarriers separately.

For RU/MRU with sizes larger than or equal to 242 tones, including: 242; 484; (484+242); 996; (996+484); (996+484+242); (2×996); (2×996+484); 3×996; (3×996+484); (4×996) the candidate LDPC tone mapping distances $D_{TM,DUP}$ may be defined for 484-, (484+242)- and 996-tone RU/MRU within each 80 MHz subblock. With the new values of $N_{SD,DUP}$, the LDPC tone mapper 308 may perform LDPC tone mapping in accordance with a candidate LDPC tone mapping distance as calculated based the number of data subcarriers $N_{SD,DUP}$. The distance is represented as candidate $D_{TM,DUP}$ in Table 7. $N_{SD,DUP}$ may result in a multiple of candidate $D_{TM,DUP}$ in order to perform tone mapping.

TABLE 7

| | RU/MRU size with each 80 MHz subblock | | | |
|---|---|---|---|---|
| | 242 | 484 | 484 + 242 | 996 |
| $N_{SD}$ (without DCM) (EHT standard) | 234 | 468 | 702 | 980 |
| $N_{SD, DCM} = [N_{SD}/2]$ (with DCM) (EHT standard) | 117 | 234 | 351 | 490 |
| $N_{SD, DUP} = [N_{SD}/4]$ | 58 | 117 | 175 | 245 |
| $D_{TM, DCM}$ (EHT standard) | 9 | 9 | 9 | 14 |
| Candidate $D_{TM, DUP}$ | [2, 29] | [3, 9, 13, 39] | [5, 7, 25, 35] | [5, 7, 35, 49] |

Further, the values of the candidate $D_{TM,DUP}$ are computed considering that the data subcarriers are to be duplicated 4 times. However, in other non-limiting embodiments, if the duplication factor changes, the candidate $D_{TM,DUP}$ may be calculated accordingly.

Returning to FIG. 9, the IDFT module 310 is configured to convert the frequency-domain data on the subcarriers to the time-domain signals and to forward the time-domain signals to a transmitter structure (not depicted) for transmission. The transmitter structure may be incorporated in the STAs 204 and AP 202. The transmitter structure may be configured to transmit the encoded data subcarriers, the duplicate encoded data subcarriers, the DCM-encoded data subcarriers, and the duplicate DCM-encoded data subcarriers over the MRU in the WLAN 200.

FIG. 16 depict a flowchart representing a method 400 for wireless communication, in accordance with various embodiments of the present disclosure.

As shown, the method 400 commences at step 402, where the Wi-Fi apparatus 300 encodes data bits to be transmitted over a multiple resource unit (MRU) in a wireless local area network (WLAN). As previously discussed, the LDPC/BCC encoder 302 is configured to receive and encode the data bits to be transmitted over an MRU in the WLAN 200.

The method 400 proceeds to step 404, where the Wi-Fi apparatus 300 creates a group of the encoded data bits based on a predetermined criterion. As noted previously, the segment parser 304 is configured to create a group of the encoded data bits for each spatial stream based on the predetermined criterion. In certain non-limiting steps, the predetermined criterion may be to determine a number of data subcarriers $N_{SD}$ associated with the MRU, and determine a number of data subcarriers $N_{SD,DUP}$ by dividing the number of data subcarriers $N_{SD}$ by a number of times the encoded data subcarriers is to be duplicated within the respective RU.

The method 400 advances to step 406, where the Wi-Fi apparatus 300 parses the encoded bits in a respective group based on a proportional ratio associated with the MRU. As noted previously, the segment parser 304 is configured to parse the encoded bits in a respective group based on a proportional ratio (as shown in table 3) associated with the MRU. Optionally, the number of encoded data bits in the group may be equal to number of data subcarriers $M \times N_{SD,DUP}$, where M is the order of modulation.

The method 400 proceeds to step 408, where the Wi-Fi apparatus 300 modulates the parsed encoded data bits to generate modulated encoded data symbols. As previously noted above, the constellation mapper 306 is configured to modulate the parsed encoded data bits to generate modulated encoded data symbols in accordance with a suitable modulation scheme such as, BPSK, QPSK, 16-QAM, 64-QAM, 1024-QAM, and 4096-QAM.

The method 400 advances to step 410, where the Wi-Fi apparatus 300 maps the modulated encoded data symbols to data subcarriers to generate encoded data subcarriers, the data subcarriers being associated with respective resource units (RUs) of the MRU. As noted above, the constellation mapper 306 is configured to map the parsed encoded data bits to data subcarriers to generate encoded data subcarriers, the data subcarriers being associated with respective resource units (RUs) of the MRU.

The method 400 advances to step 412, where the Wi-Fi apparatus 300 duplicates the encoded data subcarriers within the respective RUs. As noted above, the DUP module 306-1, 306-2, and 306-3 are configured to duplicate the encoded data subcarriers within the respective RUs.

The method 400 advances to step 414, where the Wi-Fi apparatus 300 shuffles the duplicate encoded data subcarriers across the respective RUs of the MRU. As discussed above, the shuffling module is configured to shuffle the duplicate encoded data subcarriers across the respective RUs of the MRU.

The method 400 advances to step 416, where the Wi-Fi apparatus 300 transmits the encoded data subcarriers, and the duplicate encoded data subcarriers over the MRU in the WLAN. As discussed previously, a transmitter structure incorporated in the STAs 204 and AP 202 may be configured to transmit the encoded data subcarriers and the duplicate encoded data subcarriers over the MRU in the WLAN 200.

In certain non-limiting steps of the method 400, the Wi-Fi apparatus 300 may perform dual carrier modulation (DCM) over the encoded data subcarriers associated with the respective RUs to generate DCM-encoded data subcarriers prior to duplicating the encoded data subcarriers within the respective RU.

In certain non-limiting steps of the method 400, the Wi-Fi apparatus 300 shuffles the DCM-encoded data subcarriers, the duplicate encoded data subcarriers, and the duplicate DCM-encoded data subcarriers across the respective RUs of the MRU.

In certain non-limiting steps of the method 400, the Wi-Fi apparatus 300 transmits the encoded data subcarriers, the DCM-encoded data subcarriers, the duplicate encoded data subcarriers, and the duplicate DCM-encoded data subcarriers over the MRU in the WLAN 200.

It is to be understood that the operations and functionality of the Wi-Fi apparatus 300, constituent components, and associated processes may be achieved by any one or more of hardware-based, software-based, and firmware-based elements. Such operational alternatives do not, in any way, limit the scope of the present disclosure.

It will also be understood that, although the embodiments presented herein have been described with reference to specific features and structures, it is clear that various modifications and combinations may be made without departing from such disclosures. The specification and drawings are, accordingly, to be regarded simply as an illustration of the discussed implementations or embodiments and their principles as defined by the appended claims, and are contemplated to cover any and all modifications, variations, combinations or equivalents that fall within the scope of the present disclosure.

What is claimed is:

1. An apparatus for wireless communication comprising:
at least one processor;
a memory element, in which the memory element contains instructions executable by the at least one processor;
wherein the at least one processor is configured to:
encode data bits to be transmitted over a multiple resource unit (MRU) in a wireless local area network (WLAN);
create a group of the encoded data bits for each spatial stream based on a predetermined criterion;
parse the encoded bits in the group based on a proportional ratio associated with the MRU;
modulate the parsed encoded data bits to generate modulated encoded data symbols;
map the modulated encoded data symbols to data subcarriers to generate encoded data subcarriers, the data subcarriers being associated with respective resource units (RUs) of the MRU;
duplicate the encoded data subcarriers within the respective RUs without performing dual carrier modulation (DCM) over the encoded data subcarriers;
shuffle the duplicate encoded data subcarriers across the respective RUs of the MRU;
transmit the encoded data subcarriers and the duplicate encoded data subcarriers over the MRU in the WLAN; and
wherein the predetermined criterion operates to:
determine a number of data subcarriers $N_{SD}$ associated with the MRU, and
determine a number of data subcarriers $N_{SD,DUP}$ by dividing the number of data subcarriers $N_{SD}$ by a number of times the encoded data subcarriers is to be duplicated within the respective RU.

2. The apparatus of claim 1, wherein a number of encoded data bits in the group for each spatial stream is equal to $M \times N_{SD,DUP}$, where M is the order of modulation.

3. The apparatus of claim 2, wherein the at least one processor is further configured to perform LDPC tone mapping to the encoded data subcarriers and the duplicate encoded data subcarriers in accordance with a candidate LDPC tone mapping distance as calculated based the number of data subcarriers $N_{SD,DUP}$.

4. An apparatus for wireless communication comprising:
at least one processor;
a memory element, in which the memory element contains instructions executable by the at least one processor;
wherein the at least one processor is configured to:
encode data bits to be transmitted over a multiple resource unit (MRU) in a wireless local area network (WLAN);
create a group of the encoded data bits for each spatial stream based on a predetermined criterion;
parse the encoded bits in the group based on a proportional ratio associated with the MRU;
modulate the parsed encoded data bits to generate modulated encoded data symbols;
map the modulated encoded data symbols to data subcarriers to generate encoded data subcarriers, the data subcarriers being associated with respective resource units (RUs) of the MRU;
perform dual carrier modulation (DCM) over the encoded data subcarriers associated with the respective RUs to generate DCM-encoded data subcarriers;
duplicate the encoded data subcarriers and the DCM-encoded data subcarriers within the respective RU to generate duplicate encoded data subcarriers and duplicate DCM-encoded data subcarriers;
shuffle the DCM-encoded data subcarriers, the duplicate encoded data subcarriers, and the duplicate DCM-encoded data subcarriers across the respective RUs of the MRU;
transmit the encoded data subcarriers, the DCM-encoded data subcarriers, the duplicate encoded data subcarriers, and the duplicate DCM-encoded data subcarriers over the MRU in the WLAN; and
wherein the predetermined criterion operates to:
determine a number of data subcarriers $N_{SD}$ associated with the MRU, and determine a number of data subcarriers $N_{SD,DUP}$ by dividing the number of data subcarriers $N_{SD}$ by a number of times the encoded data subcarriers is to be duplicated within the respective RU.

5. The apparatus of claim 4, wherein a number of encoded data bits in the group for each spatial stream is equal to $M \times N_{SD,DUP}$, where M is the order of modulation.

6. The apparatus of claim 4, wherein the at least one processor is further-configured to perform LDPC tone mapping to the encoded data subcarriers, the duplicate encoded data subcarriers, the DCM-encoded data subcarriers, and the duplicate DCM-encoded data subcarriers in accordance with a candidate LDPC tone mapping distance as calculated based the number of data subcarriers $N_{SD,DUP}$.

7. The apparatus of claim 4, wherein a number of the encoded data subcarriers and a number of the DCM-encoded data subcarriers is the same.

8. The apparatus of claim 4, wherein a number of the DCM-encoded data subcarriers is divided into two equal halves.

9. A method for wireless communication comprising:
   encoding data bits to be transmitted over a multiple resource unit (MRU) in a wireless local area network (WLAN);
   creating a group of the encoded data bits for each spatial stream based on a predetermined criterion;
   parsing the encoded bits in the group based on a proportional ratio associated with the MRU;
   modulating the parsed encoded data bits to generate modulated encoded data symbols;
   mapping the modulated encoded data symbols to data subcarriers to generate encoded data subcarriers, the data subcarriers being associated with respective resource units (RUs) of the MRU;
   duplicating the encoded data subcarriers within the respective RUs;
   shuffling the duplicate encoded data subcarriers across the respective RUs of the MRU;
   transmitting the encoded data subcarriers, and the duplicate encoded data subcarriers over the MRU in the WLAN; and
   wherein the predetermined criterion operates to:
      determine a number of data subcarriers $N_{SD}$ associated with the MRU, and
      determine a number of data subcarriers $N_{SD,DUP}$ by dividing the number of data subcarriers $N_{SD}$ by a number of times the encoded data subcarriers is to be duplicated within the respective RU.

10. The method of claim 8, further comprising:
    performing dual carrier modulation (DCM) over the encoded data subcarriers associated with the respective RUs to generate DCM-encoded data subcarriers prior to duplicating the encoded data subcarriers within the respective RU;
    duplicating the DCM-encoded data subcarriers within the respective RUs;
    shuffling the DCM-encoded data subcarriers, the duplicate encoded data subcarriers, and the duplicate DCM-encoded data subcarriers across the respective RUs of the MRU; and
    transmitting the encoded data subcarriers, the DCM-encoded data subcarriers, the duplicate encoded data subcarriers, and the duplicate DCM-encoded data subcarriers over the MRU in the WLAN.

11. The method of claim 8, wherein a number of encoded data bits in the group for each spatial stream is equal to $M \times N_{SD,DUP}$, where M is the order of modulation.

12. The method of claim 9 further comprising performing low density parity check (LDPC) tone mapping to the encoded data subcarriers, the duplicate encoded data subcarriers, the DCM-encoded data subcarriers, and the duplicate DCM-encoded data subcarriers in accordance with a candidate LDPC tone mapping distance as calculated based on the number of data subcarriers $N_{SD,DUP}$.

13. An apparatus for wireless communication comprising:
    at least one processor;
    a memory element, in which the memory element contains instructions executable by the at least one processor;
    wherein the at least one processor is configured to:
    encode data bits to be transmitted over a multiple resource unit (MRU) in a wireless local area network (WLAN);
    create a group of the encoded data bits for each spatial stream based on a predetermined criterion;
    parse the encoded bits in the group based on a proportional ratio associated with the MRU;
    modulate the parsed encoded data bits to generate modulated encoded data symbols;
    map the modulated encoded data symbols to data subcarriers to generate encoded data subcarriers, the data subcarriers being associated with respective resource units (RUs) of the MRU;
    perform dual carrier modulation (DCM) over the encoded data subcarriers associated with the respective RUs to generate DCM-encoded data subcarriers;
    shuffle the DCM-encoded data subcarriers across the respective RUs of the MRU;
    transmit the encoded data subcarriers and the shuffled DCM-encoded data subcarriers over the MRU in the WLAN; and
    wherein the predetermined criterion operates to:
       determine a number of data subcarriers $N_{SD}$ associated with the MRU, and
       determine a number of data subcarriers $N_{SD,DUP}$ by dividing the number of data subcarriers $N_{SD}$ by a number of times the encoded data subcarriers is to be duplicated within the respective RU.

14. The apparatus of claim 13, wherein a number of encoded data bits in the group for each spatial stream is equal to M×NSD,DCM, where M is the order of modulation.

* * * * *